(12) United States Patent
Yamada

(10) Patent No.: US 11,670,374 B2
(45) Date of Patent: Jun. 6, 2023

(54) MEMORY DEVICE INCLUDING INITIAL CHARGING PHASE FOR DOUBLE SENSE OPERATION

(71) Applicant: Micron Technology, Inc., Boise, ID (US)

(72) Inventor: Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/404,204

(22) Filed: Aug. 17, 2021

(65) Prior Publication Data

US 2023/0056107 A1 Feb. 23, 2023

(51) Int. Cl.
| | |
|---|---|
| *G11C 16/04* | (2006.01) |
| *G11C 16/10* | (2006.01) |
| *G11C 11/56* | (2006.01) |
| *G11C 16/34* | (2006.01) |

(52) U.S. Cl.
CPC .......... *G11C 16/10* (2013.01); *G11C 11/5628* (2013.01); *G11C 11/5671* (2013.01); *G11C 16/0483* (2013.01); *G11C 16/3459* (2013.01)

(58) Field of Classification Search
CPC . G11C 16/10; G11C 11/5628; G11C 11/5671; G11C 16/0483; G11C 16/3459
USPC .................................................. 365/185.03
See application file for complete search history.

(56) References Cited

U.S. PATENT DOCUMENTS

| | | | |
|---|---|---|---|
| 7,212,435 B2 * | 5/2007 | Rudeck .............. | G11C 16/3427 365/185.23 |
| 10,424,369 B2 * | 9/2019 | Harada .............. | G11C 16/3459 |
| 2009/0052243 A1 * | 2/2009 | Park .................... | G11C 11/5628 365/185.25 |
| 2009/0244967 A1 * | 10/2009 | Kim .................... | G11C 16/0483 365/185.2 |
| 2016/0172041 A1 * | 6/2016 | Sakui .................. | G11C 11/5628 365/185.12 |

* cited by examiner

*Primary Examiner* — Tha-O H Bui
(74) *Attorney, Agent, or Firm* — Schwegman Lundberg & Woessner, P.A.

(57) ABSTRACT

Some embodiments include apparatuses and methods using first and second data lines coupled to respective first and second memory cell strings; an access line shared by first and second memory cells of the first and second memory cell strings, respectively; and a control unit including circuitry to perform operations including charging the first data line to a first voltage during a first time interval of an operation performed on first and second memory cells; holding the second data line at a second voltage during the first time interval; charging the first data line to a third voltage during a second time interval of the operation; charging the second data line to a fourth voltage during the second time interval; and determining, during the second time interval of the operation, whether the first memory cell reaches a first threshold voltage and whether the second memory cell reaches a second threshold voltage.

12 Claims, 14 Drawing Sheets

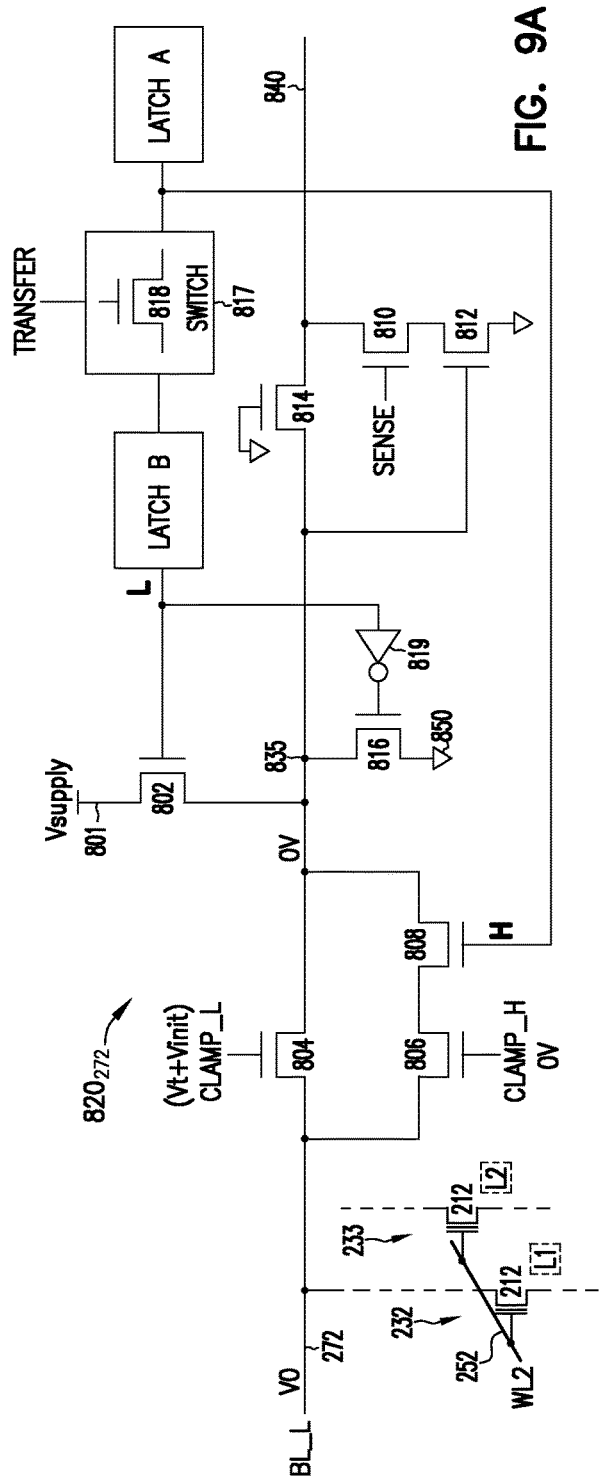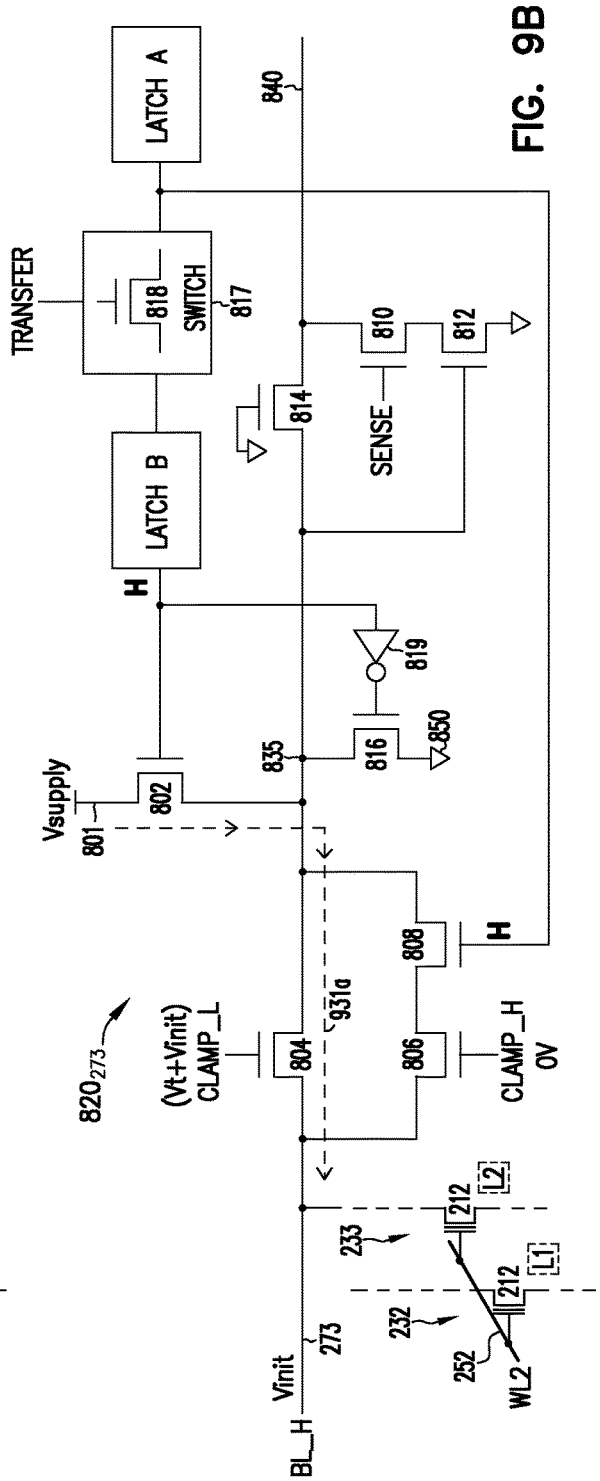

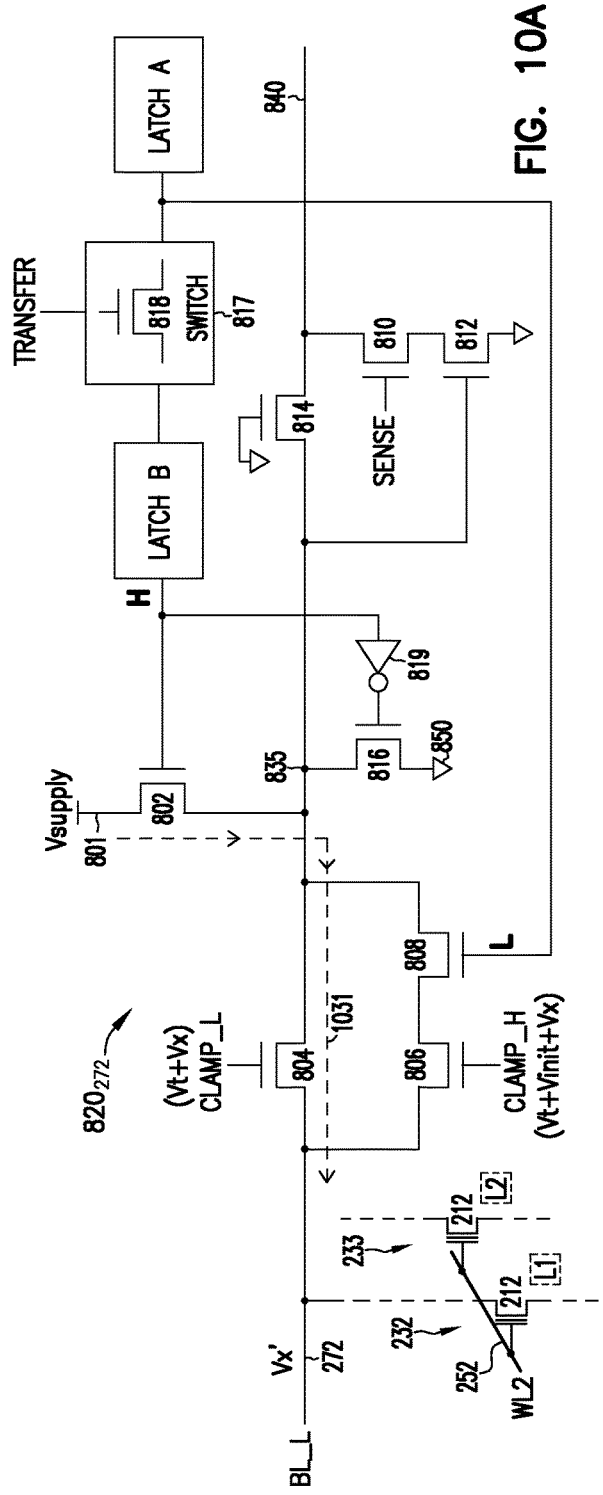
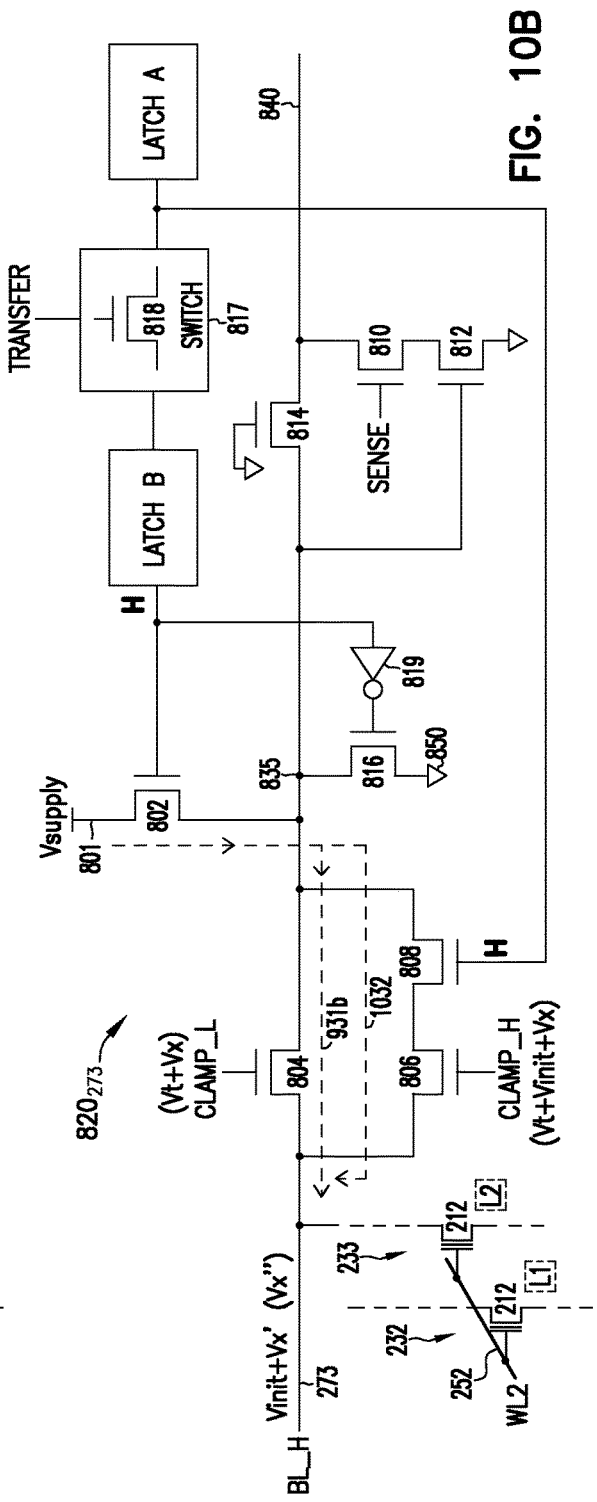
FIG. 10A
FIG. 10B

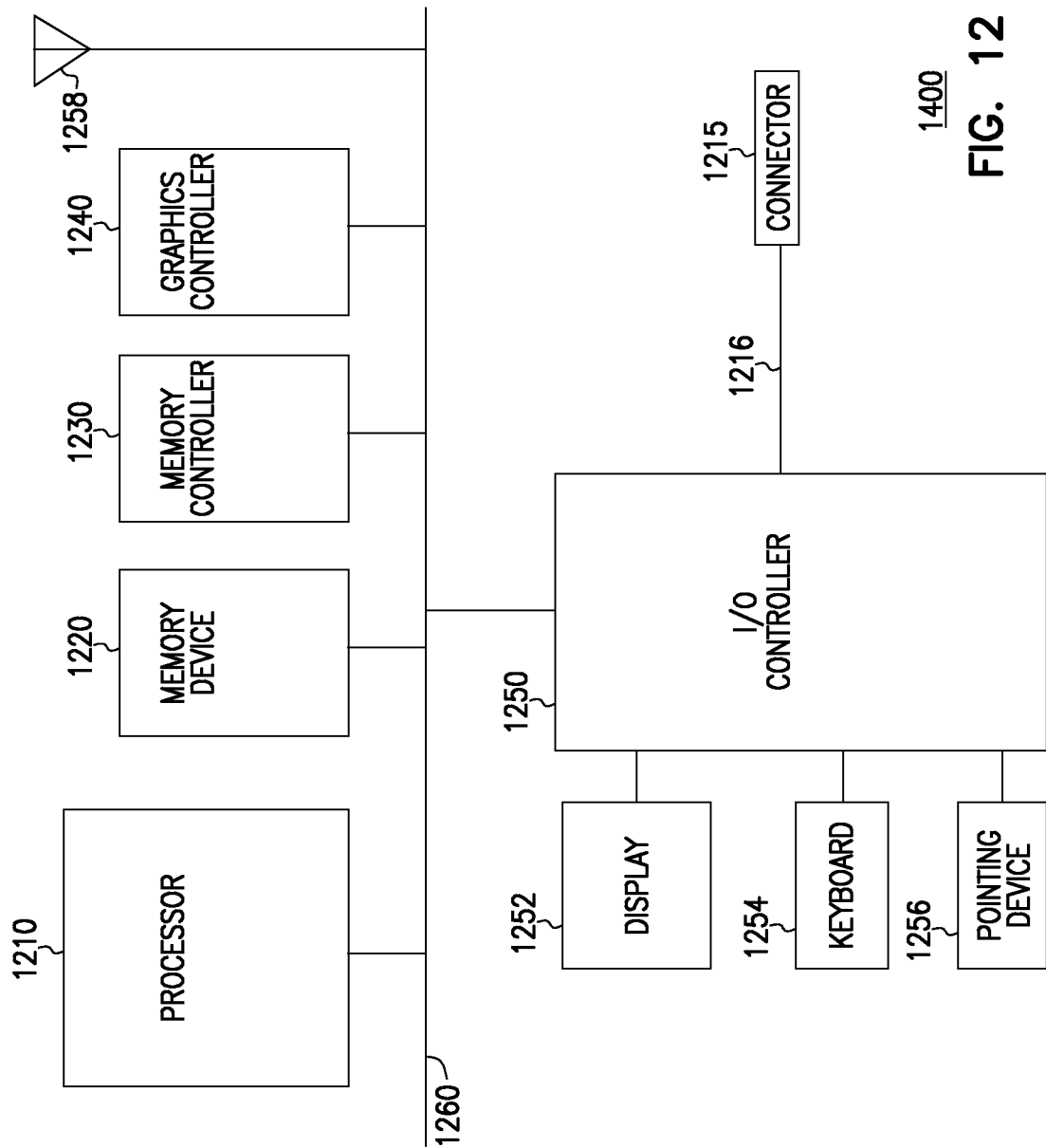

MEMORY DEVICE INCLUDING INITIAL CHARGING PHASE FOR DOUBLE SENSE OPERATION

TECHNICAL FIELD

Embodiments described herein relate to memory devices including write operation and write verify stage of the write operation of the memory devices.

BACKGROUND

Memory devices are widely used in computers and many other electronic items. A memory device usually has numerous memory cells used to store information (e.g., data). Information can be stored in the memory cells in a write operation (e.g., program operation). The values of information stored in the memory cells are usually defined by the threshold voltage levels of the memory cells. Part of a conventional write operation includes a write verify operation (e.g., program verify operation), which is performed to verify whether target memory cells (the memory cells selected to store information) reach their respective target threshold voltage levels. Some conventional write verify operations can concurrently verify multiple target threshold voltage levels in a write verify operation. Part of some of the conventional verify operations include precharging data lines coupled to target memory cells. However, such precharging in the conventional verify operations may add additional coupling capacitance between data lines. The additional coupling capacitance would take longer for the charge on the data lines to decrease. As a result, the performance of the conventional memory device can suffer.

BRIEF DESCRIPTION OF THE DRAWINGS

FIG. 9A and FIG. 9B show multiple instances of the circuit of FIG. 8 and associated with data lines during an initial charging phase of a sensing sequence of FIG. 7B, according to some embodiments described herein.

FIG. 10A and FIG. 10B show the circuits of FIG. 9A and FIG. 9B during a subsequent charging phase of the sensing sequence of FIG. 7B, according to some embodiments described herein.

FIG. 12 shows an apparatus in the form of a system including a memory device, according to some embodiments described herein.

DETAILED DESCRIPTION

The techniques described herein include a memory device having structures and methods to efficiently perform a write operation including a write verify stage of the write operation. The described memory device includes circuits and operations for applying charges on data lines and applying signals to other components of the memory device in a write verify operation to allow the memory device to perform a double sense operation in the same write verify stage of the write operation. A double sense operation involves concurrently (e.g., simultaneously) verifying two target threshold voltage levels in selected memory cells in the same write verify stage of the write operation. As mentioned above, some conventional techniques have a precharging technique during a write verify stage that may cause charge on the data lines to take a relatively longer time to decrease. In an example, the described techniques includes controlling the charges on data lines such that the time of the write verify stage of the described techniques can be relatively short. Other examples, improvements, and benefits of the described techniques are discussed below with reference to FIG. 1 through FIG. 12.

Figure 1:
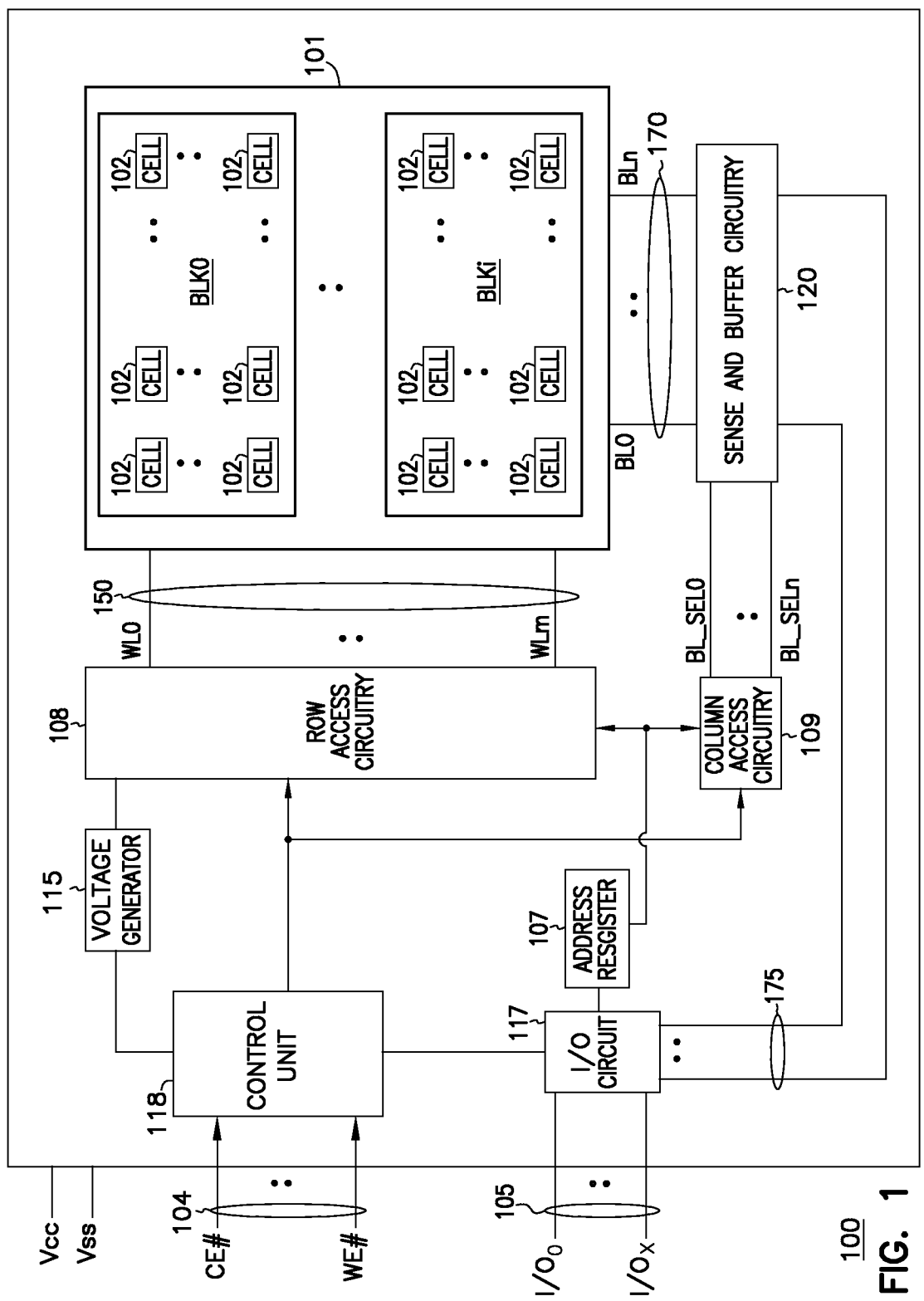
FIG. 1 shows a block diagram of an apparatus in the form of a memory device including a memory array and memory cells, according to some embodiments described herein.

FIG. 1 shows a block diagram of an apparatus in the form of a memory device 100 including a memory array 101 and memory cells 102, according to some embodiments described herein. In the physical structure of memory device 100, memory cells 102 can be arranged in memory cell strings. The memory cells 102 within the same memory cell string can be formed vertically (e.g., stacked one over another) over a substrate (e.g., a semiconductor substrate) of memory device 100. As shown in FIG. 1, memory cells 102 can be organized in memory blocks BLK0 through BLKi. Each of memory blocks BLK0 through BLKi can have its own memory cell strings and respective memory cells 102.

Memory device 100 can include access lines (which can include local word lines) 150 in a respective memory block. Memory device 100 can include data lines (which can include local bit lines) 170, which can be shared among memory blocks BLK0 through BLKi. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 in respective memory blocks BLK0 through BLKi. Memory device 100 can use data lines 170 to selectively exchange information (e.g., data) with memory cells 102 of memory blocks BLK0 through BLKi.

Memory device 100 can include row access circuitry 108 and column access circuitry 109 that can decode address information from an address register 107. Based on decoded address information, memory device 100 can determine which memory cells 102 of which sub-blocks of which memory blocks BLK0 through BLKi are to be accessed in a memory operation.

Memory device 100 can perform a write (e.g., program) operation to store (e.g., program) information in memory cells 102 of a selected memory block among memory blocks BLK0 through BLKi. Memory device 100 can perform a read operation to read (e.g., sense) information (e.g., previously stored information) from a selected memory block among memory cells 102 of memory blocks BLK0 through BLKi. Memory device 100 can use data lines 170 associated with signals BL0 through BLn to provide information to be stored in or information read (e.g., sensed) from a selected memory block among memory blocks BLK0 through BLKi. Memory device 100 can also perform an erase operation to erase information from one or more of memory blocks BLK0 through BLKi.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry. Memory device 100 can include a voltage generator 115, which can generate different voltages for use during memory operations (e.g., read, write, and erase operations).

As shown in FIG. 1, memory device 100 can include a control unit 118 that can be configured to control memory operations of memory device 100 based on control signals on lines 104. Example of the control signals include a chip enable signal CE #, a write enable signal WE #, and other signals. The control signals on lines 104 can indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Control unit 118 can include circuitry (and any combination of software and firmware) that can be configured to perform common operations of the memory device with the additional functionality to perform double sensing technique during a write verify stage of a write operation of the memory device as described herein. Control unit 118 can be realized as a memory controller that can be configured to perform operations described herein. Control unit 118 can be included in any of the memory device described below (e.g., memory device 200) to perform operations described herein.

As shown in FIG. 1, memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of memory blocks BLK0 through BLKi and provide the value of the information to lines (e.g., global data lines) 175. Sense and buffer circuitry 120 can also be configured to use signals on lines 175 to determine the value of information to be stored (e.g., programmed) in memory cells 102 of memory blocks BLK0 through BLKi in a write operation based on the values (e.g., voltage values) of signals on lines 175 in the write operation.

Memory device 100 can include input/output (I/O) circuitry 117 to exchange information (e.g., data, address, and instruction information) with an external device (e.g., (e.g., a memory controller or a processor) through lines (e.g., I/O lines) 105. Signals $I/O_0$ through $I/O_x$ on lines 105 can represent information read from or stored in memory cells 102 of memory blocks BLK0 through BLKi. Lines 104 and lines 105 can include nodes within memory device 100 or pins (or solder bumps, or solder balls) on a package where memory device 100 can reside. Other devices external to memory device 100 (e.g., a memory controller or a processor) can communicate with memory device 100 through lines 104 and 105.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive random-access memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 10.

Figure 2:
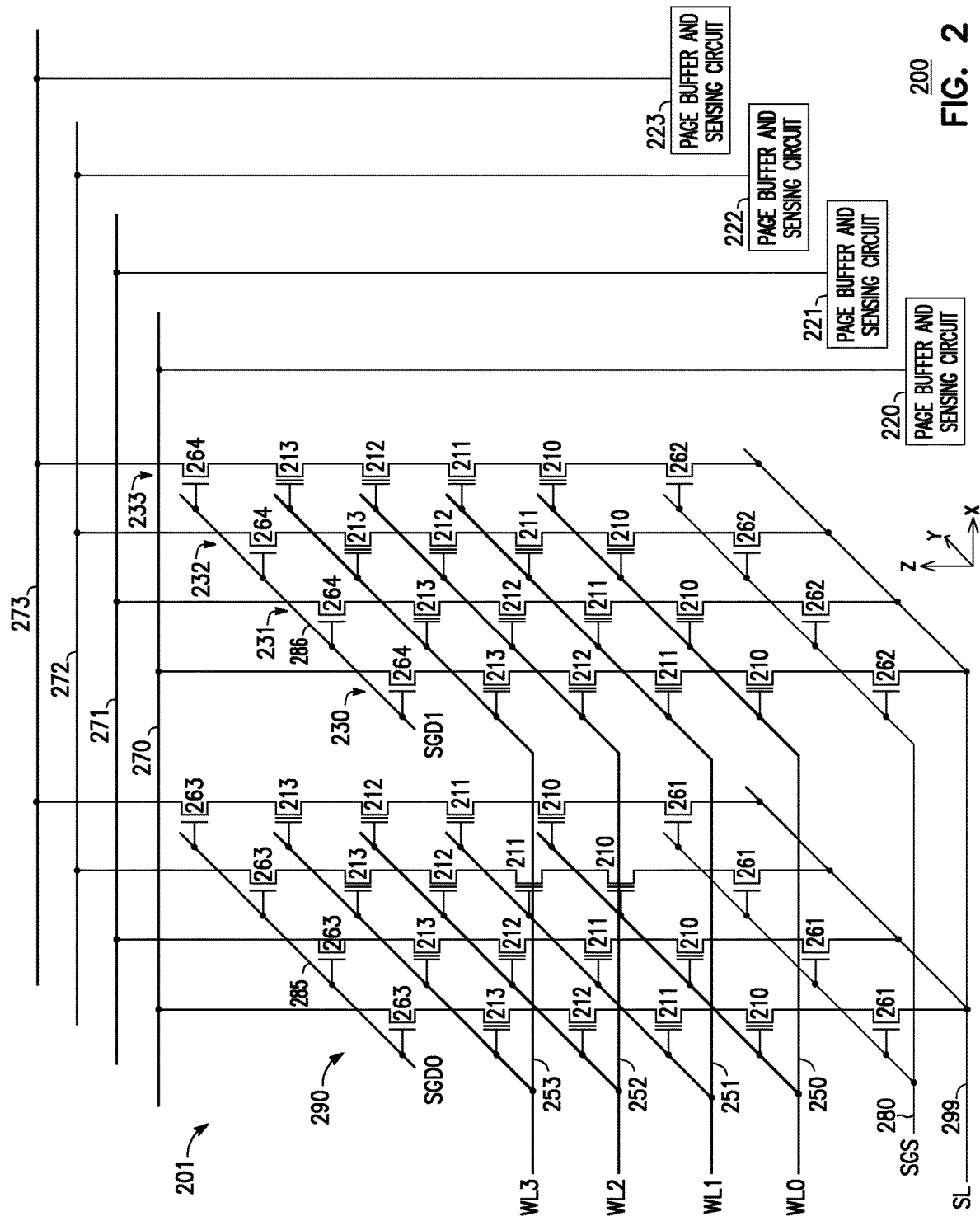
FIG. 2 shows a schematic diagram of a portion of a memory device including a memory array, data lines, and page buffer and sensing circuits, according to some embodiments described herein.

FIG. 2 shows a schematic diagram of a portion of a memory device 200 including a memory array 201, data lines 270, 271, 272, and 273, and page buffer and sensing circuits 220, 221, 222 and 223, according to some embodiments described herein. Memory device 200 can correspond to memory device 100 of FIG. 1, such that memory array 201 can correspond to memory array 101 of memory device 100. Memory array 201 can include a memory block 290, which can correspond to one of memory blocks BLK0 through BLKi of FIG. 1. For simplicity, FIG. 2 shows one memory block (e.g., memory block 290) of memory device 200. However, memory device 200 can include numerous memory blocks. In FIG. 2, directions X, Y, and Z can be relative to the physical directions (e.g., three dimensional (3D) dimensions) of the structure of memory device 200. For example, the Z-direction can be a direction perpendicular to (e.g., vertical direction with respect to) a substrate of memory device 200. The Z-direction is perpendicular to the X-direction and Y-direction (e.g., the Z-direction is perpendicular to an X-Y plane of memory device 200).

Data lines 270, 271, 272, and 273 of memory device 200 can correspond to data lines 170 of memory device 100. Data lines 270, 271, 272, and 273 can be structured as conductive lines to provide information to be stored in or information read (e.g., sensed) from a selected memory cell in memory device 200.

Memory device 200 can include control gates 250, 251, 252, and 253 that can carry corresponding signals (e.g., word line signals) WL0, WL1, WL2, and WL3. Each of control gates 250, 251, 252, and 253 can form part of a respective access line of memory device 200. Each of data lines 270, 271, 272, and 273 can be structured as a conductive line and can form part of a respective data line of memory device 200. FIG. 2 shows four control gates 250, 251, 252, and 253 and four data lines 270, 271, 272, and 273 as an example. The number of such control gates and lines can vary.

Memory device 200 can memory cells 210, 211, 212, and 213; transistors (e.g., source select transistors) 261 and 262; and transistors (e.g., drain select transistors) 263 and 264. Memory cells 210, 211, 212, and 213 and transistors 261, 262, 263, and 264 can be arranged in memory cell strings, such as memory cell strings 230, 231, 232, and 233. For simplicity, only four of the memory cell strings 230, 231, 232, and 233 are labeled. FIG. 2 shows an example of eight memory cell strings and four memory cells 210, 211, 212, and 213 in each memory cell string. However, the number of memory cell strings and the number of memory cells in each memory cell string can vary.

As shown in FIG. 2, each memory cell string can be coupled between a source 299 and a respective data line (e.g., one of data lines 270, 271, 272, and 273). For example, memory cell string 232 can include memory cells 210, 211, 212, and 213, and respective transistors 262 and 264 coupled between data line 272 and source 299. In another example, memory cell string 233 can include memory cells 210, 211, 212, and 213, and respective transistors 262 and 264 coupled between data line 273 and source 299.

Source 299 can be structured as a conductive line and can form part of a source line (e.g., conducive region) of memory device 200 and can carry a signal, such as signal SL (e.g., source line signal). In the structure of memory device 200, memory cells 210, 211, 212, and 213 can be physically located in multiple levels of memory device 200, such that memory cells 210, 211, 212, and 213 in the same memory cell string can be stacked one over another in multiple levels of memory device 200.

As shown in FIG. 2, transistors 261 and 262 can share the same gate 280. Gate 280 can form part of a select line (e.g., source select line) of memory device 200. The select line (e.g., source select line) can be structured as a conductive line (e.g., a level (e.g., a layer) of a conductive region). Transistors 261 and 262 can be controlled (e.g., turned on or turned off) by the same signal, such as an SGS signal (e.g., source select gate signal) associated with gate 280. During a memory operation, such as a read or write operation, transistors 261 and 262 can be turned on (e.g., by activating an SGS signal) to couple the memory cell strings of memory device 200 to a source 299. Transistors 261 and 262 can be turned off (e.g., by deactivating the SGS signal) to decouple the memory cell strings of memory device 200 from source 299.

Transistors 263 can share the same gate (e.g., drain select gate) 285. Transistors 264 can share the same gate (e.g., drain select gate) 286. Gates 285 and 286 are separated from each other (e.g., electrically uncoupled from each other). Each of gates 285 and 286 can form part of a respective select line (e.g., drain select line) of memory device 200. The select line (e.g., drain select line) can be structured as a conductive line (e.g., a level (e.g., a layer) of a conductive region).

Transistors 263 and 264 can be controlled (e.g., turned on or turned off) by SGD0 and SGD1 signals (e.g., drain select gate signals), respectively, to selectively couple the memory cell strings of memory device 200 to their respective data lines 270, 271, 272, and 273, during a memory operation (e.g., a read or write operation). During a memory operation (e.g., a read or write operation), only one of the SGD0 and SGD1 signals can be activated at a time. For example, during a memory operation, the SGD1 signal can be activated (to turn on transistors 264) to couple memory cell strings 230, 231, 232, and 233 to data lines 270, 271, 272, and 273, respectively, through respective transistors 264. In this example, the SGD0 signal can be deactivated to decouple the other memory cell strings (not labeled in FIG. 2) from respective data lines 270, 271, 272, and 273 while memory cell strings 230, 231, 232, and 233 are coupled to data lines 270, 271, 272, and 273, respectively. In this example, information can be stored in or read from a selected memory cell in each of memory cell strings 230, 231, 232, and 233 (selected memory cell strings).

Each of memory cells 210, 211, 212, and 213 can be configured (e.g., structured) to store multiple bits of information. In a write operation, memory device 200 can cause a selected memory cell to have a particular level (e.g., threshold voltage level (also called a state)) to reflect the value (e.g., binary value) of information stored in the selected memory cell. In a read operation, the value (e.g., binary value) of information read from a selected memory cell can be based on the threshold voltage level (e.g., the state) of the selected memory cell. In this description, "threshold voltage", "level", and "state" are used interchangeably. "Target threshold voltage", "target level", and "target state" are also used interchangeably.

During a write operation, page buffer and sensing circuits 220, 221, 222 and 223 can operate to provide information to be stored in selected memory cells of respectively selected memory cell strings 230, 231, 232, and 233. During a read operation, page buffer and sensing circuits 220, 221, 222 and 223 can operate to provide information read from selected memory cells of respectively selected memory cell strings 230, 231, 232, and 233. During part of a write operation (e.g., during a write verify stage), page buffer and sensing circuits 220, 221, 222 and 223 can also operate to allow memory device 200 to determine whether selected memory cells (among memory cells 210, 211, 212, and 213) reach their respective target levels (e.g., respective target threshold voltages). The target levels are the levels (e.g., threshold voltages) that correspond to the values (e.g., target values) of information intended to be stored in the selected memory cells during another part (e.g., during a write stage performed before the write verify stage) of the write operation.

Figure 3:
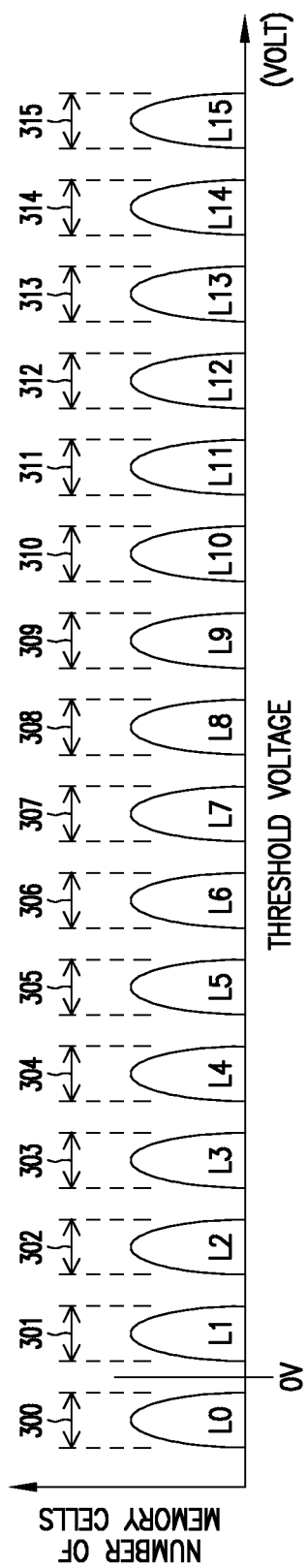
FIG. 3 is a diagram showing different levels corresponding to threshold voltages ranges for a number of memory cells of the memory device of FIG. 2, according to some embodiments described herein.

FIG. 3 is a diagram showing different levels (e.g., states) L0 through L15 and corresponding threshold voltages ranges (e.g., threshold voltage distributions) 300-315 for a number of memory cells of memory device 200 of FIG. 2, according to some embodiments described herein. As described above, each of memory cells 210, 211, 212, and 213 (FIG. 2) can be configured to store multiple bits of information. FIG. 3 shows an example where each of memory cells 210, 211, 212, and 213 of memory device 200 is assumed to be configured to store four bits of information (e.g., "0000", "0101" or another value among 16 combinations of four bits). However, the techniques described herein can be applicable to other configurations where each of memory cells 210, 211, 212, and 213 can be configured to store less than four bits or more than four bits.

In FIG. 3, levels L0-L15 (16 levels L0 through L15) can correspond to 16 threshold voltage ranges. Each of levels L0-L15 represents a unique combination of four bits. As shown in FIG. 3, level L0 can correspond to the lowest threshold voltage range 310 (which has the lowest voltage range among the 16 threshold voltage ranges). Level L15 can correspond to threshold voltage range 315 (which has the highest voltage range among the 16 threshold voltage ranges). For a 4-bit per cell (as assumed above), each of memory cell 210, 211, 212, and 213 can be programmed to have a threshold voltage corresponding to one of 16 levels L0-L15 to store a unique combination of four bits (e.g., one of "0000", "0001", or another value of a combination of four bits). During a write operation memory device 200 can cause the threshold voltage of a selected memory cell to be within a target threshold voltage range corresponding to one of levels L0-L15 to reflect the value (4-bit value) of the stored information, depending on the value (binary value) of information to be stored in the selected memory cell. For example, if a selected memory cell is selected to store information corresponding to level L1 (a target level of level L1), then memory device 200 can cause the selected memory cell to have (e.g., to hold) a threshold voltage within threshold voltage range 301 (which corresponds to target level L1 in this example). Thus, in a write operation in the example of FIG. 3, a target threshold voltage of a selected memory cell can correspond to a level (e.g., target state) among levels L0-L15.

Memory device 200 can store information in a selected memory cell (or selected memory cells) during a write stage of a write operation. Storing information in a memory cell includes causing the threshold voltage of a selected memory cell to be within a target threshold voltage range (e.g., within one of threshold voltage ranges 300 through 315). Memory device 200 can also perform a write verify stage as part of a write operation. The write verify stage is performed to determine whether information stored in selected memory cells (during the write stage) reach their target values.

Figure 4:
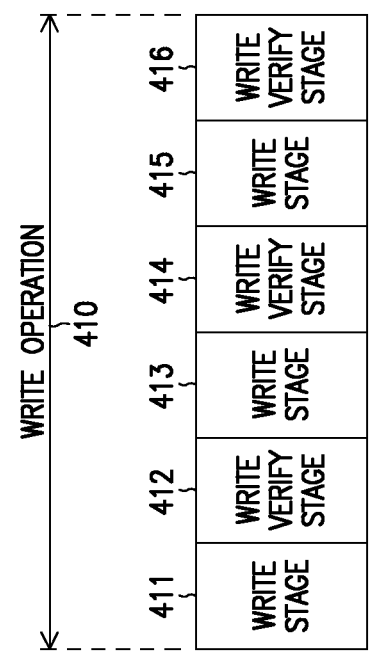
FIG. 4 shows a diagram illustrating an example write operation of the memory device of FIG. 2 including write stages and write verify stages of the write operation, according to some embodiments described herein.

FIG. 4 shows a diagram illustrating an example write operation 410 of memory device 200 of FIG. 2 including different write stages 411, 413, and 415 and write verify stages 412, 414, and 416 of write operation 410, according to some embodiments described herein. As shown in FIG. 4, memory device 200 can perform a write stage, and then perform a write verify stage right after each write stage. For example, memory device 200 performs write stage 411 and then write verify stage after write stage 412, write stage 413 and then write verify stage 414 after write stage 413, and write stage 415 and then write verify stage 416 after write stage 415. FIG. 4 shows an example where write operation 410 that has three write stages and three corresponding write verify stages. However, write operation 410 can have a different number of write stages and corresponding write verify stages, depending on how fast or how slow a selected memory cell reaches its target level during a write stage of the write operation.

Memory device 200 can perform a write stage (e.g., one of write stages 411, 413, and 415) to store information in selected memory cells. Memory device 200 can perform a write verify stage to determine (e.g., to verify or to check) whether the selected memory cells reach their respectively target levels (e.g., respective threshold voltages among threshold voltage ranges 300 through 315).

Figure 5:
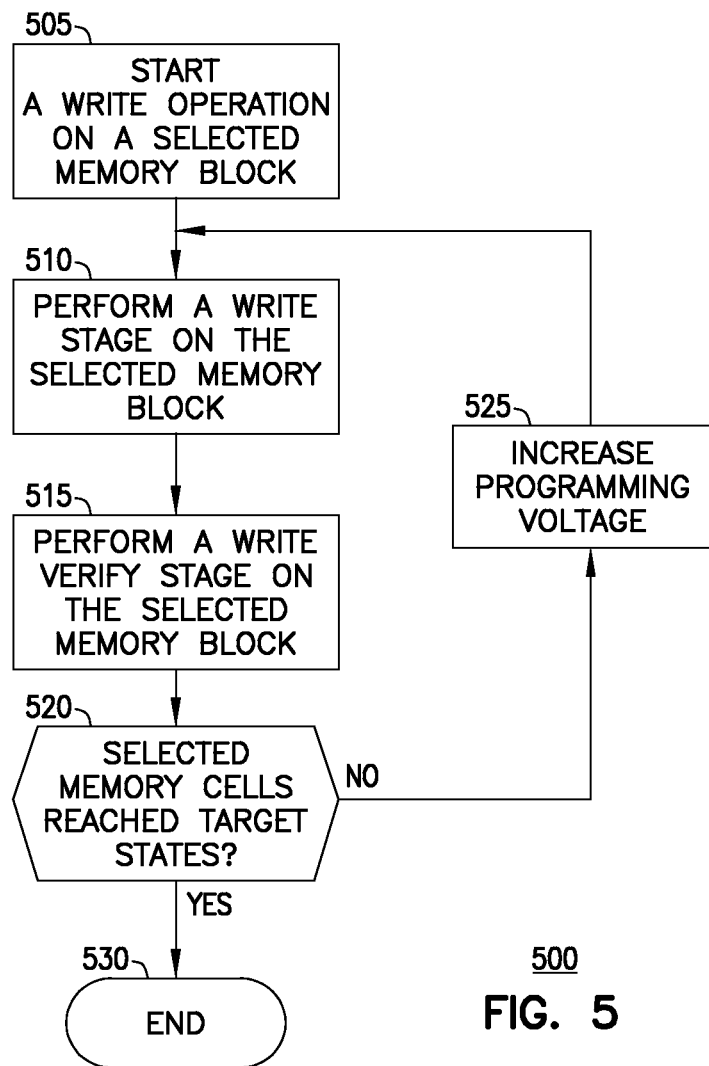
FIG. 5 is a flow diagram showing a method of performing a write operation in a memory device, according to some embodiments described herein.

FIG. 5 is a flowchart showing a method 500 for performing a write operation in memory device 200, according to some embodiments described herein. Method 500 can be part of an algorithm included (e.g., configured) in memory device 200 (e.g., included in a control unit of memory device 200, like control unit 118 of FIG. 1). Method 500 can be performed by software, firmware, hardware circuitry (e.g., logic circuitry), or any combination of software, firmware, and hardware circuitry. Such software, firmware, hardware circuitry, or any combination of or any combination of such software, firmware, and hardware circuitry can be configured (e.g., can be included) in memory device 200 (e.g., in the control unit of memory device 200). Memory device 200 is used in method 500 as an example. However, method 500 can be used in other memory devices. As shown in FIG. 5, method 500 can include activities (e.g., memory operations) 505, 510, 515, 520, 525, and 530.

Method 500 can start the write memory operation at activity 505, which can include selecting memory cells (e.g., target memory cells) to store information (e.g., data) in a write operation. The selected memory cells can be some of memory cells 210, 211, 212, and 213 of memory device 200 of FIG. 2. Memory device 200 can start method 500 after it receive a write command (a program command) from an external device (e.g., a memory controller or a processor).

Activity 510 can include performing a write stage (e.g., a program stage) on the selected memory cells (e.g., target memory cells) to store information in the selected memory cells. The write stage can include one of the write stages (e.g., write stage 411) of FIG. 4. Performing the write stage in activity 515 can include applying a programming voltage to a selected control gate coupled to the selected memory cells. For example, if memory cells 212 (FIG. 2) of memory cell strings 230, 231, 232, and 233 are selected during the write operation of method 500, then the programming voltage can be applied to control gate 252 (FIG. 2). Activity 510 in FIG. 5 can cause the selected memory cells to have respective target levels based on the value of information to be stored in the selected memory cells. For example, activity 515 can cause each of the selected memory cells to have one of levels L0-L15 of FIG. 3. In some examples, memory cells of memory device 200 can be at level L0 (e.g., an erased state) before activity 510 is performed. Thus, in method 500, if a particular memory cell is selected to store information corresponding to level L0, then activity 510 may skip programming that particular memory cell because that particular memory cell is already at the target level (e.g., level 0).

Activity 515 can include performing a write verify stage (e.g., a program verify stage) of the write operation of method 500. The write verify stage can include one of the write verify stages 412, 416, and 418 of FIG. 4. Performing the write verify stage in activity 515 in FIG. 5 can include sensing a data line coupled to the memory cell string of the selected memory cells, and determining whether the selected memory cells reach their respective target levels responsive to sensing the data line. Sensing and determining whether a selected memory cell reaches its target level can be understood by one skilled in the art. In FIG. 5, the write verify stage in activity 515 can include write verify stage 612 described below with reference to FIG. 6.

Activity 520 (FIG. 5) can include determining whether all selected memory cells reach their respective target levels. Label "NO" at activity 520 indicates that fewer than all (not all of) selected memory cells reach their target levels. In this case, method 500 can continue with activity 525. The label "YES" at activity 520 indicates that all selected memory cells have reached (or are deemed to have reached) their target states. In this case, method 500 can continue with activity 530.

Activity 525 can be performed responsive to a determination (performed by activity 520) that fewer than all (not all of) selected memory cells have reached (or are deemed to have reached) their respective target states. Activity 525 can include adjusting (e.g., increasing) the value of the programming voltage (applied in activity 510). For example, activity 525 can increase the voltage (e.g., increase the amplitude of a programming pulse) used in activity 510. After activity 525 is performed, method 500 can perform a repeat sequence (e.g., perform a repeat loop) to repeat some or all of activities 510, 515, 520, and 525 at least one more time in response to the result from activity 520 performed in the repeat sequence.

Activity 530 can include ending (completing) the write operation responsive to a determination (performed by activity 520) that all of the selected memory cells have reached (or are deemed to have reached) their respective target states.

As described above in activity 510, in some examples, some particular memory cells of memory device 200 may be selected to store information corresponding to level L0 (e.g., a target level L0). Thus, in such examples, memory device 200 may exclude the particular memory cells (e.g., memory cells having a target level L0) from the write stage (in activity 510) and the write verify stage (in activity 515) because memory device 200 may determine that such memory cells already have level L0. Memory device 200 may determine particular memory cells having level L0 from a result of an erase verify stage, which may be performed by memory device 200 before a write operation of method 500. Thus, the write verify stage in activity 515 may skip determining whether a selected memory cell has a target level L0 if the target level to be stored in the selected memory cell is level L0.

Figure 6:
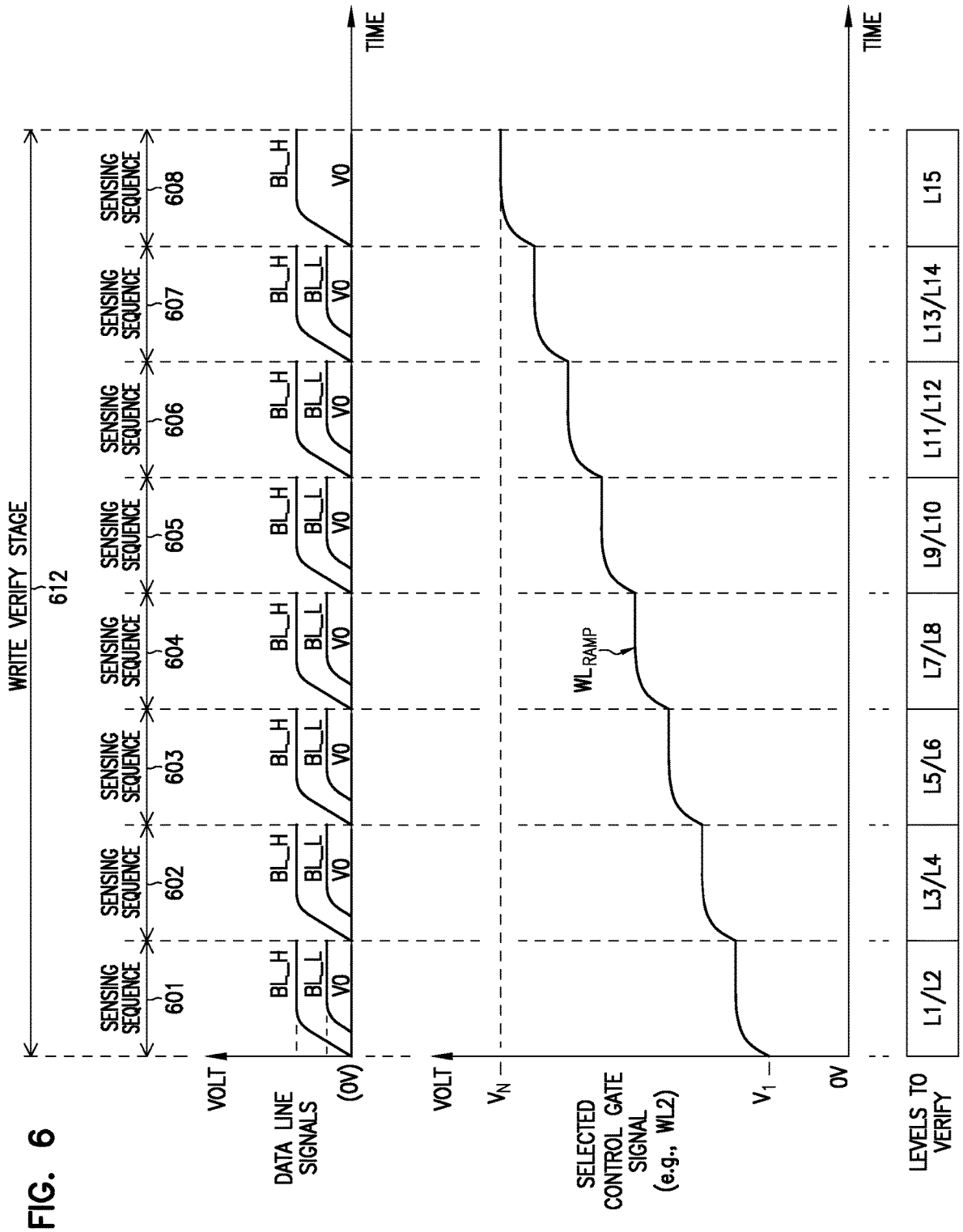
FIG. 6 shows an example of a write verify stage including sensing sequences, according to some embodiments described herein.

FIG. 6 shows an example of a write verify stage 612 including sensing sequences 601 through 608, according to some embodiments described herein. As assumed above, each memory cell of memory device 200 can be configured to store multiple bits of information, such as four bits of information. In the example of 4-bit per cell configuration, each of the memory cells of memory device 200 can store information corresponding to one of 16 possible combinations of four bits that correspond to 16 levels, such as levels L0 through L15 of FIG. 3. In the example of FIG. 6, memory device 200 can sequentially perform sensing sequences 601 through 608 to sequentially verify levels L1 through L15 (target levels L0 through L15) of the selected memory cells. As described above, memory device 200 can be configured such that level L0 (e.g., erased level, not shown in FIG. 6) may be skipped in write verify stage 612 of FIG. 6. For example, memory device 200 can be configured to verify level L0 during an erase operation. Thus, in this example, write verify stage 612 may skip verifying level L0 for a target memory cell (or memory cells).

As shown in FIG. 6, in each sensing sequence 601 through 607, memory device 200 can concurrently (e.g., simultaneously) verify two levels (double levels) corresponding to information stored in different selected memory cells. For example, memory device 200 can perform sensing sequence 601 to verify levels L1 and L2 (double levels that include level L1 and L2), sensing sequence 602 to verify levels L3 and L4 (double levels that includes levels L3 and L4) and so on. Memory device 200 can perform sensing sequence 608 to verify only one level (e.g., level 15) instead of two levels.

As shown in FIG. 6, sensing sequence 601 can be performed to determine (e.g., to verify or to check) whether the memory cells selected to store information corresponding to levels L1 and L2 reach their respective target levels (levels L1 and L2). Sensing sequence 602 can be performed to determine whether the memory cells selected to store information corresponding to levels L3 and L4 reach their respective target levels (levels L3 and L4). In this pattern, sensing sequences 603, 604, 605, 606, 607, and 608 can be performed to determine whether the memory cells selected to store information reach their respective target levels (respective levels L5 through L15, as shown in FIG. 6).

As shown in FIG. 6, memory device 200 can apply a signal (voltage signal) $WL_{RAMP}$ to a selected control gate (e.g., control gate 252). The signal on the selected control gate (e.g., control gate 252 in this example) can be called a selected control gate signal. Thus, in this example, signal WL2 (which is associated with control gate 252 in FIG. 2) can have a waveform corresponding to the waveform of signal $WL_{RAMP}$ of FIG. 6. The waveform of signal $WL_{RAMP}$, as shown in FIG. 6, can have a ramp shape, such that it can have a positive slope with an increased value (voltage value) from one sensing sequence to the next succeeding sensing sequence. Signal $WL_{RAMP}$ can be a linear ramp signal or non-linear ramp signal. As shown in FIG. 6, signal $WL_{RAMP}$ can have a positive slope corresponding to voltages from voltage V1 (positive voltage) to voltage $V_N$. During a particular sensing sequence, the value of signal $WL_{RAMP}$ can remain unchanged within that particular sensing sequence.

Memory device 200 can include a voltage generator (e.g., voltage generator 115 of FIG. 1). Memory device 200 can include a control unit (e.g., control unit 116 of FIG. 1) to cause the voltage generator to provide to provide (e.g., apply) appropriate voltages (to signal $WL_{RAMP}$, such that signal $WL_{RAMP}$ can have the waveform shown in FIG. 6.

During a particular sensing sequence, the data lines associated with the memory cells being verified in that particular sensing sequence can be called active data lines. During a particular sensing sequence, the data lines associated with the memory cells not being verified in that particular sensing sequence can be called inactive data lines.

Memory device 200 can apply signal BL_L, BL_H, and V0 to respective data lines of memory device 200 during each of sensing sequences 601, 602, and 607. During each sensing sequence (e.g., each of sensing sequences 601 through 608), active data lines can be applied with (e.g., can have) either signal BL_L or signal BL_H, depending on the target levels of the selected memory cells coupled to the active data lines during a sensing sequence. During each sensing sequence (e.g., each of sensing sequences 601 through 608), inactive data lines can be applied with (e.g., can have) signal V0. In the description here, the term "signal V0" and "voltage V0" are used interchangeably. Voltage V0 can be provided by a signal (e.g., signal V0) that can remain at 0V (e.g., remains coupled to ground). Signals BL_L and BL_H can be provided with different voltages, such that the waveforms of signals BL_L and BL_H are different from each other.

Levels L1-L15 in a write verify stage (e.g., write verify stage 612) can be divided into eight groups L1-L2, L3-L4, L5-L6, L8-L8, L9-L10, L11-L12, L13-L14, and L15). The levels in each group can be levels that are adjacent to each other. For example, levels L1 and L2 are adjacent to each other. Levels L3 and L4 are adjacent to each other, and so on. The levels (e.g., levels L1 and L2) in each group can correspond to threshold voltages that are adjacent to each other in the range of threshold voltages (as shown in FIG. 3). The groups can be verified sequentially (one group after another). For example, group L1-L2 can be verified in sensing sequence 601, group L3-L4 can be verified in sensing sequence 602, group L4-L5 can be verified in sensing sequence 603, and so on.

Figure 7A:
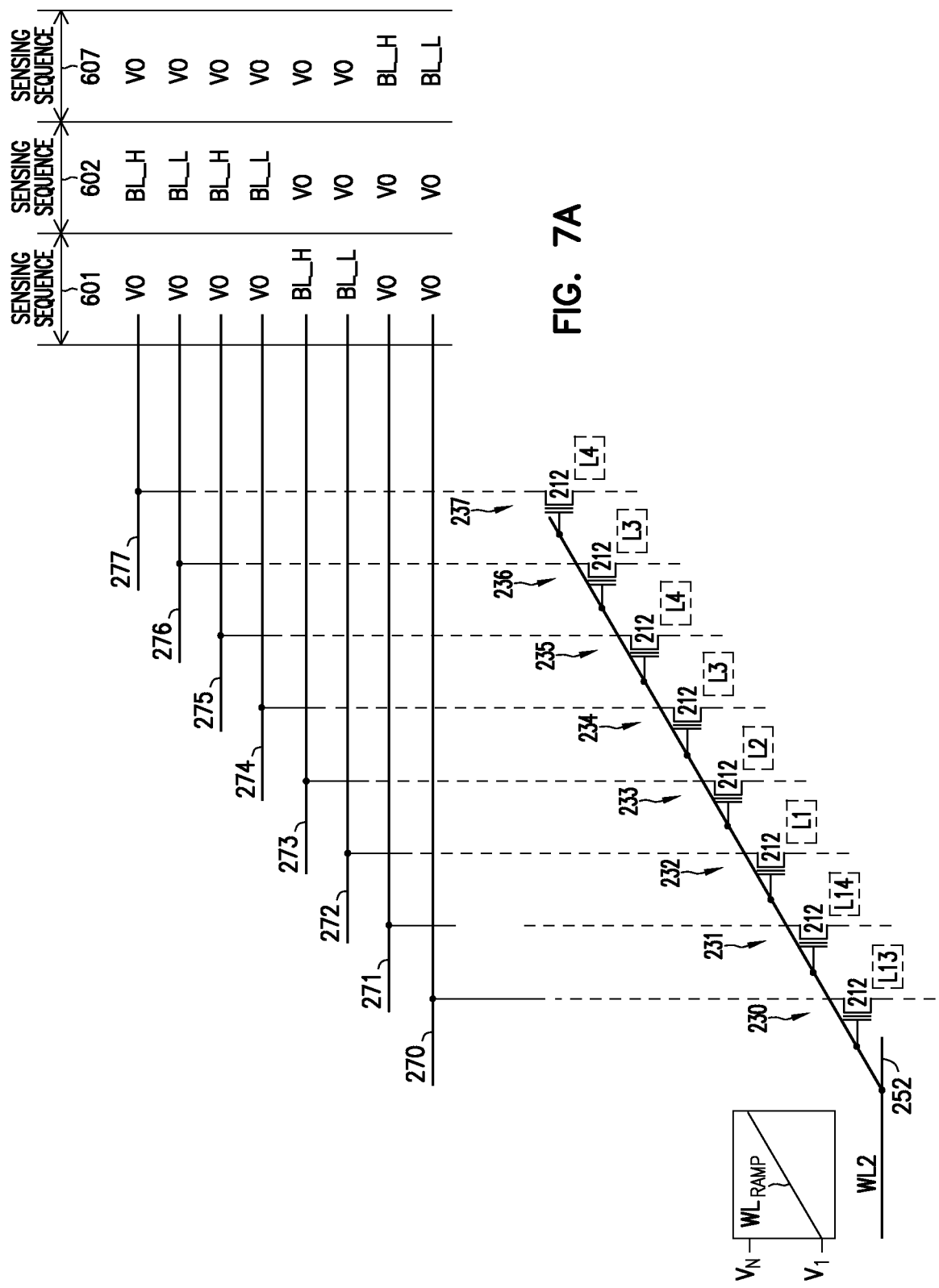
FIG. 7A shows an example where memory cells of memory cell strings of the memory device of FIG. 2 are selected to store information having values corresponding to respective levels, according to some embodiments described herein.

FIG. 7A shows an example where memory cells 212 of memory cell strings 230 through 237 are selected to store information having values corresponding to respective levels (e.g., target levels) L1, L2, L3, L4, L13 and L14, according to some embodiments described herein. For simplicity, only memory cell 212 of each of memory cell strings 230 through 237 is shown in FIG. 7. Other memory cells 210, 211, and 213 and transistors (e.g., source and drain select transistors) 262 and 264 of memory cell strings 230 through 237 (shown in FIG. 2) are omitted from FIG. 7. For simplicity, only some of levels L0-L15 (e.g., levels L1, L2, L3, L4, L13 and L14) are assumed to be stored (e.g., to be randomly stored) in respective memory cells 212 of memory cells strings 230 through 237. As shown in FIG. 7A, some of memory cells 212 are assumed to store information corresponding to the same level. For example, memory cells 212 of memory cell strings 234 and 236 are assumed to store information corresponding to level L3. In another example, memory cells 212 of memory cell strings 235 and 237 are assumed to store information corresponding to level L4. Sensing sequences 601, 602, and 607 in FIG. 7A are the same as those described above with reference to FIG. 6.

Memory device 200 can perform sensing sequences 601, 602, and 607 to verify respective levels L1, L2, L3, L4, L13 and L14 in memory cells 212. FIG. 7A shows only three sensing sequences 601, 602, and 607 (out of eight groups L1-L2, L3-L4, L5-L6, L8-L8, L9-L10, L11-L12, L13-L14, and L15) because only three different groups of levels (e.g., group L1-L2, L3-L4, and L13-L14) are assumed to be stored memory cells 212 of the example of FIG. 7A. The number of sensing sequences performed in a write verify stage depends on the number of groups of levels stored in the memory cells in a previous write stage.

As shown in FIG. 7A, memory device 200 can perform sensing sequence 601 (FIG. 7A) to verify levels L1 and L2, which are target levels of memory cells 212 of respective memory cell strings 232 and 233 in the example of FIG. 7A. Memory device 200 can perform sensing sequence 602 to verify levels L3 and L4, which are target levels of memory cells 212 of respective memory cell strings 234, 235, 236, and 237 in the example of FIG. 7A. Memory device 200 can perform sensing sequence 607 to verify levels L13 and L14, which are target levels of memory cells 212 of respective memory cell strings 230 and 231 in the example of FIG. 7A.

During sensing sequence 601 in the example of FIG. 7A, data lines 272 and 273 can be called active data lines because data lines 272 and 273 are associated with memory cells 212 of memory cell strings 232 and 233 that are being verified during sensing sequence 601. During sensing sequence 601 in the example of FIG. 7A, data lines 270, 271, 274, 275, 276, and 277 can be called inactive data lines because these data lines are associated with memory cells 212 of memory cell strings 230, 231, 234, 235, 236, and 237 that are not being verified during sensing sequence 601. Similarly, during sensing sequence 602 in the example of FIG. 7A, data lines 274, 275, 276, and 277 can be called active data lines, and data lines 270, 271, 272, and 273 can be called inactive data lines. During sensing sequence 607 in the example of FIG. 7A, data lines 270 and 271 can be called active data lines, and data lines 272, 273, 274, 275, 276, and 277 can be called inactive data lines during sensing sequence 607.

Figure 7B:
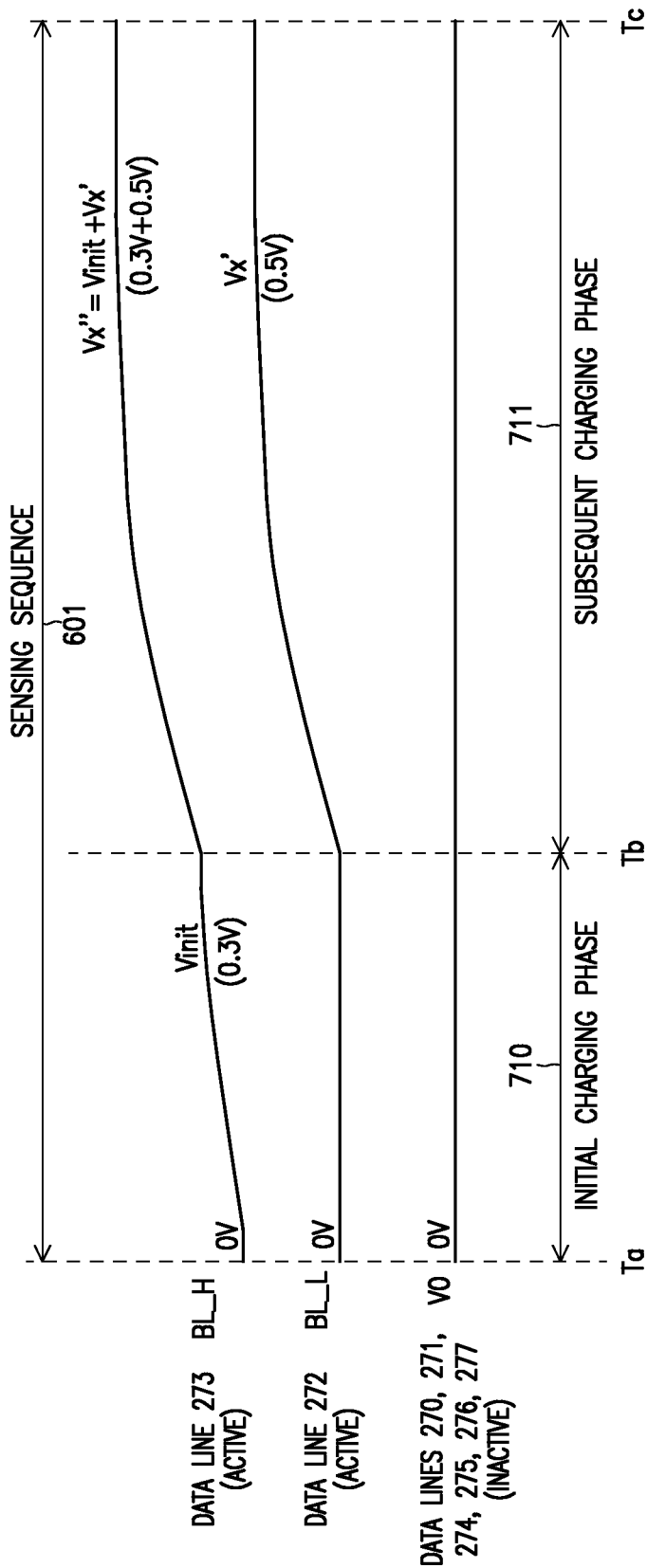
FIG. 7B, FIG. 7C, and FIG. 7D show waveforms of signals on the data lines of memory device of FIG. 7A during a sensing sequence of a write verify stage, according to some embodiments described herein.
Figure 7C:
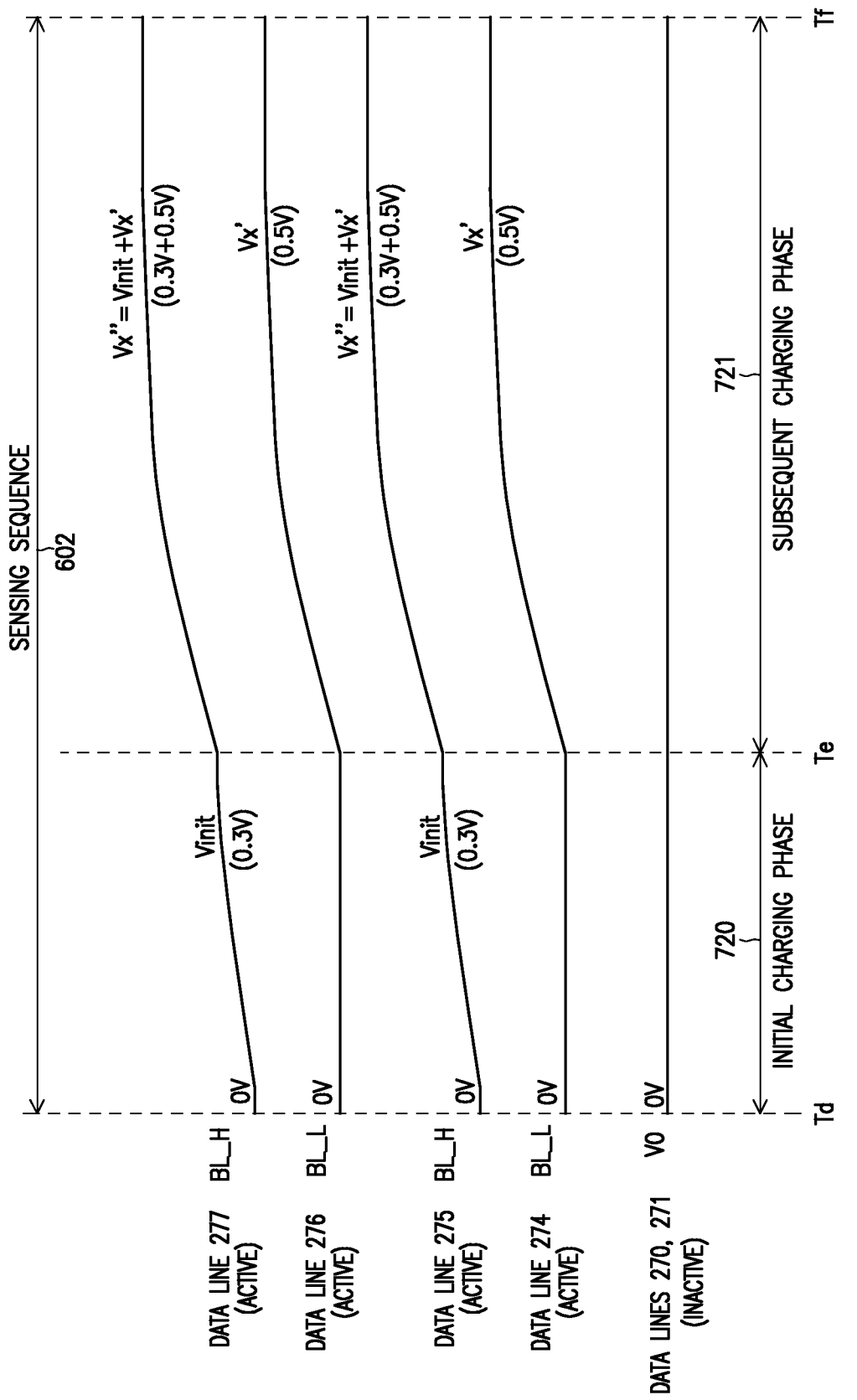
Figure 7D:
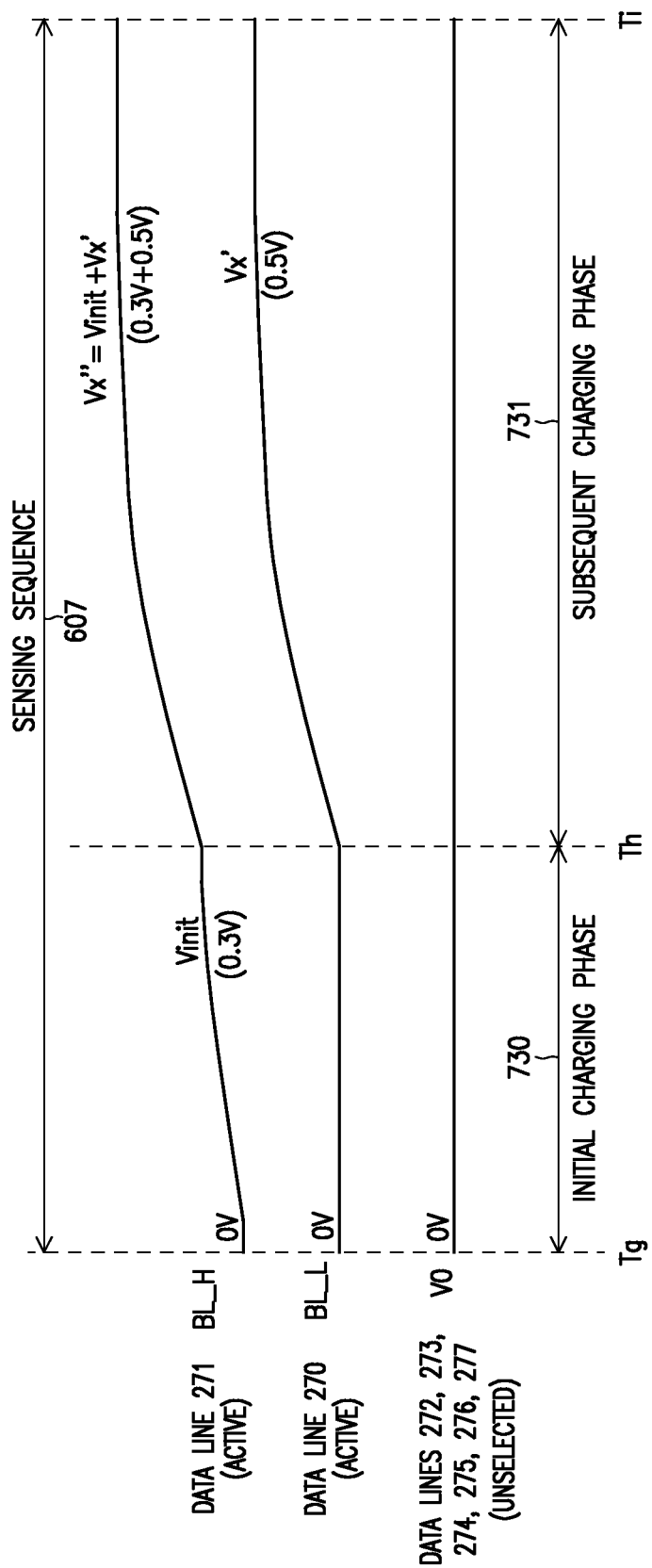

As shown in FIG. 7A, memory device 200 can apply signals BL_L and BL_H to respective active data lines, and signal V0 to inactive data lines. Signal $WL_{RAMP}$ applied to control gate 252 is the same as signal $WL_{RAMP}$ described above with reference to FIG. 6. In the example of FIG. 7A, signal W2 on control gate 252 can correspond to signal $WL_{RAMP}$. Thus, in the example of FIG. 7A, signal W2 on control gate 252 can have the waveform as signal $WL_{RAMP}$ during sensing sequences 601, 602, and 607. FIG. 7B, FIG. 7C, and FIG. 7D shows waveforms of signals on data lines 270 through 277 during sensing sequences performed by memory device 200 during different sensing sequences 601, 602, and 607 of FIG. 7A.

FIG. 7B shows waveforms of the signals on data lines 270 through 277 of memory device of FIG. 7A during sensing sequence 601, according to some embodiments described herein. As shown in FIG. 7B, sensing sequence 601 can include an initial charging phase 710 and a subsequent charging phase 711. Memory device 200 can perform initial charging phase 710 between times Ta and Tb. Memory device 200 can perform subsequent charging phase 711 between times Tb and Tc. Initial charging phase 710 occurs before subsequent charging phase 711.

During initial charging phase 710, memory device 200 can operate to charge data lines 272 and 273 (active data lines in this example) to different voltages. During a portion of subsequent charging phase 711 (e.g., a portion near time Tc), memory device 200 can operate to sense signals on data lines 272 and 273 to determine whether selected memory cells of memory cell strings coupled to data lines 272 and 273 reach their respective target levels.

Memory device 200 can apply voltage V0 (e.g., 0V) to data lines 270, 271, 274, 275, 276, and 277 (inactive data lines in this example) during initial charging phase 710 and during subsequent charging phase 711 of sensing sequence 601. For example, memory device 200 can couple data lines 270, 271, 274, 275, 276, and 277 to ground and hold these data lines at ground during initial charging phase 710 and during subsequent charging phase 711. Thus, during the entire sensing sequence 601, the voltage on data lines 270, 271, 274, 275, 276, and 277 can remain unchanged (e.g., can remain at 0V) while the voltages on respective data lines 272 and 273 can change (as represented by respective signals BL_L and BL_H).

In the example of FIG. 7A, data lines 272 and 273 are associated with memory cells 212 (of memory cell strings 232 and 233) that are selected to store information corresponding to levels L1 and L2, respectively. Level L1 corresponds to a target level having a lower threshold voltage than level L2. During initial charging phase 710 in FIG. 7B, memory device 200 can charge the active data line associated with the memory cell having a higher target level (e.g., higher target threshold voltage) to a positive voltage, and hold the active data line associated with the memory cell having a lower target level (e.g., lower target threshold voltage) at voltage V0 (e.g., 0V). Thus, as shown in FIG. 7B, memory device 200 can charge data line 272 from voltage V0 to a voltage Vinit while holding data line 272 at voltage V0 (e.g., by coupling data line 272 to ground). Voltage Vinit is a positive voltage. Voltage Vinit can be less than the value of the threshold voltage of a transistor (e.g., transistor 804 or 806 shown in FIG. 8) coupled to a respective data line of memory device 200.

In this description, a specific value of a voltage is used as an example to help describe relationships among the voltages. However, other voltage values can be used. For example, FIG. 7B shows 0.3V for voltage Vinit as an example. Other positive values can be used.

During subsequent charging phase 711 in FIG. 7B, memory device 200 can charge the active data lines to different positive voltages Vx' and Vx". Voltage Vx" is greater than voltage Vx'. For example, voltage Vx" can be a sum of voltage Vinit and voltage Vx' (e.g., Vx"=Vinit+Vx'). Memory device 200 can charge active data lines associated with memory cells having higher target level and lower target level (e.g., levels L2 and L1, respectively) to voltages Vx" and Vx', respectively. Voltage Vx' can be greater than voltage Vinit. For example, voltage Vx' can be 0.5V. Thus, as an example, voltage Vx" can be 0.8V if Vinit=03.V and Vx'=0.5V.

FIG. 7C and FIG. 7D show waveforms of signals on active and inactive data lines 270 through 277 of memory device of FIG. 7A during sensing sequence 602 and 607, respectively, according to some embodiments described herein. The waveforms of data lines 270 through 277 are similar to those of the waveforms in FIG. 7B except that active data lines (and inactive data lines) in each of sensing sequence 602 and 607 are different from those in sensing sequence 601 in FIG. 7B.

As shown in FIG. 7C, sensing sequence 602 can include an initial charging phase 720 performed between times Td and Te, and a subsequent charging phase 721 performed between times Te and Tf after initial charging phase 720. During subsequent charging phase 721 (e.g., near time T0), memory device 200 can operate to sense data lines 274, 275, 276, and 277 to determine whether selected memory cells reach their respective target levels.

Data lines 274 and 276 (active data lines) are associated with memory cells selected to store information corresponding to level L3 (as shown in FIG. 7A). Data lines 275 and 277 (active data lines) are associated with memory cells selected to store information corresponding to level L4 (as shown in FIG. 7A). Between levels L3 and L4, level L3 is a lower level, and level L4 is higher level.

During initial charging phase 720, memory device 200 can charge data lines 275 and 277 (active data lines) to voltage Vinit while holding data lines 274 and 276 (active data lines) at voltage V0. During subsequent charging phase 721, memory device 200 can charge data lines 275 and 277 to voltage Vx" and data lines 274 and 276 to voltage Vx'. Memory device 200 can hold data lines 270, 271, 272, and 273 (inactive data lines) at voltage V0 during initial charging phase 720 and subsequent charging phase 721.

As shown in FIG. 7D, sensing sequence 607 can include an initial charging phase 730 performed between times Tg and Th, and a subsequent charging phase 731 performed between times Th and Ti after initial charging phase 730. During subsequent charging phase 731 (e.g., near time Ti), memory device 200 can operate to sense data lines 270 and 271 to determine whether selected memory cells reach their respective target levels.

Data lines 270 and 271 (active data lines) are associated with memory cells selected to store information corresponding to level L13 and L14, respectively (as shown in FIG. 7A). Between levels L13 and L14, level L13 is a lower level, and level L14 is a higher level.

During initial charging phase 730, memory device 200 can charge data line 271 (active data line) to voltage Vinit while holding data line 270 (active data line) at voltage V0. During subsequent charging phase 731, memory device 200 can charge data line 271 to voltage Vx" and data line 270 to voltage Vx'. Memory device 200 can hold data lines 272, 273, 274, 275, 276, and 277 (inactive data lines) at voltage V0 during initial charging phase 730 and subsequent charging phase 731.

In the above description with reference to FIG. 7A, FIG. 7B, FIG. 7C, and FIG. 7D (and other figures (e.g., FIG. 11) described herein), the difference between the voltages on signals BL_L and BL_H during an initial charging phase (e.g., initial charging phase 710, 720, or 730) can be expressed by an equation Vinit−V0=Delta1 (Vinit minus V0 is equal to Delta1). The difference between the voltages on signals BL_L and BL_H during a subsequent charging phase (e.g., subsequent charging phase 711, 721, or 731) can be expressed by an equation Vx"−Vx'=Delta2 (Vx" minus Vx' is equal to Delta2). The value (voltage value) of Delta2 can be based on the value (voltage value) of Delta1. For example, the value of Delta2 can be proportional to the value of Delta1, such that if the value of Delta1 increases (relative to a selected value (e.g., 0.3V)) then the value of Delta2 also increases. Similarly, if the value of Delta1 decreases (relative to a selected value (e.g., 0.3V)) then the value of Delta2 also decreases. The value of Delta2 can be the same as value of Delta1. For example, Delta2=Delta1=Vinit if V0=0, as shown in FIG. 7B, FIG. 7C, and FIG. 7D. As an example, if the value of Delta1 is 0.3V, the value of Delta2 can also be 0.3V.

In the above description with reference to FIG. 7A, FIG. 7B, FIG. 7C, and FIG. 7D (and other figures (e.g., FIG. 11) described herein), the value of voltage V0 can be 0V, and the value of Vinit is a positive value. However, the value of voltage V0 can be greater than 0V as long as the value of voltage V0 is less than the value of voltage Vinit.

Figure 8:
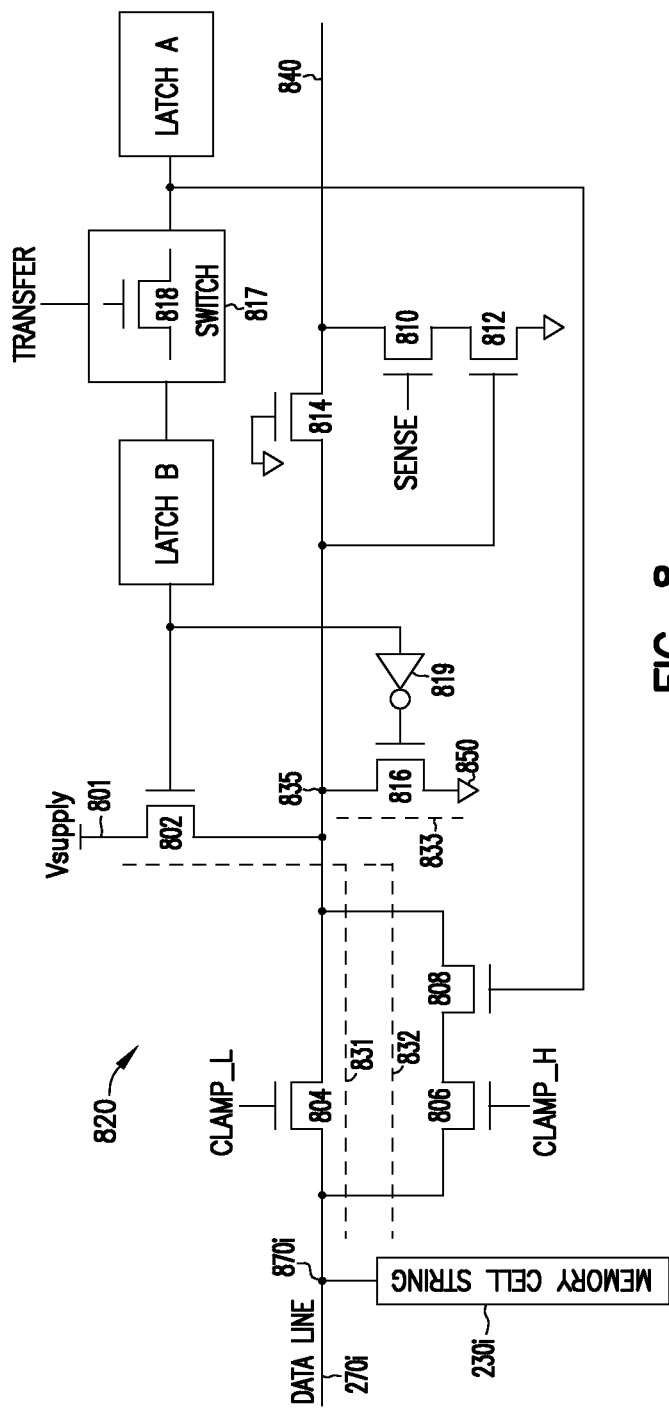
FIG. 8 shows a schematic diagram of a circuit which can be part of buffer and sense amplifier circuitry of the memory device of FIG. 2, according to some embodiments described herein.

FIG. 8 shows a schematic diagram of circuit 820 which can be part of buffer and sense amplifier circuitry of memory device 200, according to some embodiments described herein. Circuit 820 can correspond to (or can be included in) one of page buffer and sensing circuits 220, 221, 222, and 223 of FIG. 2. As shown in FIG. 8, circuit 820 can be coupled to a data line 270*i*, which can be one of the data lines (e.g., one of data lines 270 through 277 of FIG. 2 and FIG. 7A) of memory device 200. Each of the data lines of memory device 200 can be coupled to a respective circuit 820. Thus, in the example of FIG. 7A, there can be eight different circuits 820 coupled to eight respective data lines (data lines 270 through 277). During a write verify stage (e.g., write verify stage 612 of FIG. 6), circuit 820 (FIG. 8) can be used as part of buffer and sense circuitry of memory device 200 to apply an appropriate signal (one of signals BL_L, BL_H, and V0 in FIG. 7A) to a respective data line (data line 270*i*).

FIG. 8 also shows a memory cell string 230*i*, which can be one of memory cell strings 230 through 237 (FIG. 2 and FIG. 7A). Memory cell string 230*i* can be coupled to data line 270*i* at a node 870*i*. Each circuit 820 can be shared by memory cell strings that are coupled to the same data line.

As shown in FIG. 8, circuit 820 can be coupled to nodes (e.g., supply nodes) 801 and 850. Node 801 can be configured to receive a voltage Vsupply, which can be a supply voltage (e.g., voltage Vcc) of memory device 200. Node 850 can be configured to be coupled to ground. Thus, node 850 can be part of ground connection (e.g., ground node or ground plane) of memory device 200. Circuit 820 can include latches A and B, transistors 802, 804, 806, 808, 810, 812, 814, and 818, and an inverter 819 having connections as shown in FIG. 8. Circuit 820 can be configured to receive signals, such as signals CLAMP_L, CLAMP_H, and SENSE at the gates of transistors 804, 806, and 810.

As shown in FIG. 8, circuit 820 can include circuit paths 831, 832, and 833. Circuit paths 831 and 832 can share a node 835. Circuit paths 831, 832, and 833 can include respective transistors (e.g., transistors 802, 804, 806, 808, and 816) where the transistor can have the same transistor type. For example, transistors 802, 804, 806, 808, and 816 (which are included in respective circuit paths 831, 832, and 833) can be n-channel metal-oxide semiconductor (NMOS) transistors.

Transistors 802 and 804 can be part of (can be included in) circuit path 831 that is coupled between nodes 801 and 870$i$. Transistors 806 and 808 can be part of (can be included in) circuit path 832 that is coupled between nodes 835 and node 870$i$. Transistor 816 can be part of (can be included in) circuit path 833 that is coupled between nodes 835 and 850. As shown in FIG. 8, circuit path 831 can have a portion (between nodes 835 and 870$i$) that is parallel with circuit path 832 between nodes 835 and 870$i$.

Circuit 820 can include a node 840, which is coupled to other circuits of memory device 200. The other circuits can be part of input/output circuitry to transfer information (in the form of a signal through node 840) between data line 270$i$ and other circuits of memory device 200. For example, during a sensing operation (which can be part of the write verify stage) of memory device 200, information sensed from a selected memory cell of the memory cell string coupled to circuit 820 can be provided to other circuits through node 840.

Circuit path 831 can be configured to conduct current (current between nodes 801 and 870$i$) during an initial charging phase (e.g., initial charging phase 710 in FIG. 7B) associated with a write verify stage of a write operation of memory device 200. Circuit path 832 can be configured to not conduct current during an initial charging phase (e.g., initial charging phase 710 in FIG. 7B) associated with a write verify stage of a write operation of memory device 200 while circuit path 831 conducts current. Circuit paths 831 and 832 can be configured to conduct current (between nodes 801 and 870$i$) during a subsequent charging phase (e.g., subsequent charging phase 711 in FIG. 7B) associated with a write verify stage of a write operation of memory device 200.

In operation, transistors 804 and 806 can be part of clamp circuits on circuit paths 831 and 832, respectively. Transistors 804 and 806 can operate to provide (e.g., to charge) an appropriate voltage (e.g., clamped voltage) on data line 270$i$ and to maintain (e.g., to clamp) the voltage on data line 270$i$ at a specific (e.g., clamped) voltage at different times. Transistor 802 can be a pull-up circuit that can be turned on (or turned off) to provide (or not to provide) a voltage to data line 270$i$ through one or both of circuit paths 831 and 832. Transistor 816 (which is controlled by the signal at the output node of inverter 819) can be turned on to couple node 835 to node 850 through circuit path 833. Transistor 816 can be turned off to decouple node 835 from node 850 (to not couple node 835 to node 850). Transistors 810 and 812 can be controlled by signal SENSE and the signal at node 835, respectively, during a sensing phase (e.g., part of a write verify stage). Information on node 840 during a sensing phase can correspond to the value of information stored in a selected memory cell of the memory cell string.

Latches A and B can be configured to hold information that can be used to provide information (e.g., information L and H in FIG. 9A, FIG. 9B, FIG. 10A, and FIG. 10B) to control transistors on circuit paths 831, 832, and 833. Appropriate voltages can be provided to data line 270$i$, node 835, and other components (e.g., gates of transistor) of circuit 820 based in part on the information from latches A and B during a write operation (e.g., during a write verify stage). Switch 817 can receive information TRANSFER to change (e.g., update) the value of information in latches A and B during a part of a write verify stage of the write operation. More detailed operation of circuit 820 is described below with reference to FIG. 9A, FIG. 9B, FIG. 10A, FIG. 10B, and FIG. 11.

FIG. 9A and FIG. 9B show circuits $820_{272}$ and $820_{273}$ and associated data lines 272 and 273 during initial charging phase 710 of sensing sequence 601 of FIG. 7B, according to some embodiments described herein. Circuits $820_{272}$ and $820_{273}$ are two different circuits that can be part of page buffer and sensing circuits 222 and 223, respectively, of FIG. 2. Circuits $820_{272}$ and $820_{273}$ are two different copies of circuit 820 of FIG. 8. As shown in FIG. 9A and FIG. 9B, circuits $820_{272}$ and $820_{273}$ are coupled to different data lines (data lines 272 and 273). For example, data line 272 in FIG. 9A can correspond to data line 270$i$ of a copy (an instance) of circuit 820 of FIG. 8. Data line 273 in FIG. 9B can correspond to data line 270$i$ of another copy of circuit 820 FIG. 8.

As shown in FIG. 9A and FIG. 9B, memory cell strings 232 and 233 are coupled to data lines 272 and 273, respectively. Memory cell string 232 (which is coupled to data line 272) in FIG. 9A can correspond to memory cell string 230$i$ of a copy of circuit 820 FIG. 8. Memory cell string 233 (which is coupled to data line 273) in FIG. 9B can correspond to memory cell string 230$i$ of another copy of circuit 820 FIG. 8. The operations of circuits $820_{272}$ and $820_{273}$ during initial charging phase 710 associated with FIG. 9A and FIG. 9B, respectively, are described below. In the description below, initial charging phase 710 and subsequent charging phase 711 of sensing sequence 601 correspond to initial charging phase 710 and subsequent charging phase 711 of sensing sequence 601 shown in FIG. 7B.

In FIG. 9A and FIG. 9B, during initial charging phase 710, signal CLAMP_H can be provided with 0V (zero volts) that can be ground potential. Signals CLAMP_L can be provided with a voltage having a value represented by the sum of a voltage Vt and a voltage Vinit. Voltage Vt can represent the threshold voltage of the transistors (e.g., n-channel transistors) of circuit 820. For example, voltage Vt corresponds to a threshold voltage of transistors 804 and 806. Voltage Vinit can be a predetermined voltage that can be based on the difference between the values of voltages on data lines 272 and 273 during a time interval near the end of subsequent charging phase 711 (e.g., time interval 1105 of FIG. 11, described in more detail below with reference to FIG. 11).

In FIG. 9A and FIG. 9B, information L and information H can be in the form of signals (e.g., voltage signals) provided to the gates of respective transistors of circuits $820_{272}$ and $820_{273}$ to control (e.g., turn on or turn off) the respective transistors. The value of information L can correspond to a logic level (e.g., binary 0). The value of information H can correspond to another logic level (e.g., binary 1). The values of information L and H can be based on the values of respective information contained in (e.g., stored in) latches A and B. The values contained in latches A and B can be based on the values of target levels of selected memory cells during a write operation of memory device 200. For example, during a write verify stage, information can be provided to (e.g., latched in) latches A and B of circuit $820_{272}$ (FIG. 9A) that can be based on the target levels (e.g., one of level L0 through L15) of selected memory cells of the memory cell string coupled to data line 272. Similarly, during a write verify stage, information can be provided to latches A and B of circuit $820_{273}$ (FIG. 9B) that can be based on the target levels (e.g., one of level L0 through L15) of selected memory cells of the memory cell string coupled to data line 273.

During initial charging phase 710 associated with FIG. 9A and FIG. 9B, the data line (e.g., data line 272 in FIG. 9A) coupled to the memory cell string having a selected memory cell with a lower target level (between two target levels being verified) can be held at 0V (e.g., at node 850). The data line (e.g., data line 273 in FIG. 9B) coupled to the memory cell string having a selected memory cell with a higher target level (between two target levels being verified) can charge to a positive voltage (e.g., voltage Vinit). Thus, during initial charging phase 710, data line 272 (FIG. 9A) can be held at voltage V0 (e.g., 0V), and data line 273 (FIG. 9B) can be charged to a voltage Vinit (Vinit>V0, where V0=0V). The value of voltage Vinit can be less than the value of the threshold voltage of transistor 804 or 806.

During initial charging phase 710 in FIG. 9A, information L at the output node of latch B of circuit $820_{272}$ can have a value, such that transistor 816 can be turned on to couple node 835 of circuit $820_{272}$ to node 850 (e.g., ground potential). Data line 272 can be held at ground potential (at node 850) through transistor 804. Signal CLAMP_H can be provided with 0V to turn off transistor 806. This can disable the circuit path that includes transistors 806 and 808 between node 835 and data line 272.

During initial charging phase 710 in FIG. 9B, signal CLAMP_H can be provided with 0V to turn off transistor 806. This can disable the circuit path that includes transistors 806 and 808 between node 835 and data line 273. Information H at the output node of latch B of circuit $820_{273}$ can have a value, such that transistor 816 can be turned off. Thus, unlike node 835 of circuit $820_{272}$ (that is coupled to node 850 (ground)) of FIG. 9A, node 835 of circuit $820_{273}$ of FIG. 9B is not coupled to node 850 (e.g., not coupled to ground).

Transistor 802 can be turned on based on the value of information H at the output node of latch B of circuit $820_{273}$ of FIG. 9B. Transistor 804 of circuit $820_{273}$ can also be turned on by signal CLAMP_L. Thus, as shown in FIG. 9B, a current path 931a can be formed between nodes 801 and data line 273. Current path 931a can be part of circuit path 831 (FIG. 8) that includes transistors 802 and 804. Current path 931a allows data line 273 to be charged to a positive voltage (e.g., voltage Vinit).

Thus, as described above, during initial charging phase 710, data line 273 (FIG. 9B) can be charged to voltage Vinit (a positive voltage) while data line 272 (FIG. 9A) can be held at voltage V0 (e.g., 0V), which is less than voltage Vinit.

FIG. 10A and FIG. 10B show circuits $820_{272}$ and $820_{273}$ and associated data lines 272 and 273 during subsequent charging phase 711 of sensing sequence 601 of FIG. 7B, according to some embodiments described herein. Circuit $820_{272}$ in FIG. 10A is the same as circuits $820_{272}$ of FIG. 9A. However, the signals in circuits $820_{272}$ in FIG. 10A are associated with subsequent charging phase 711, whereas the signals in circuits $820_{272}$ in FIG. 9A are associated with initial charging phase 710. Similarly, circuit $820_{273}$ in FIG. 10B is the same as circuits $820_{273}$ of FIG. 9B. However, the signals in circuit $820_{273}$ in FIG. 10B are associated with subsequent charging phase 711, whereas the signals in circuit $820_{273}$ in FIG. 9B are associated with initial charging phase 710. In the description with respect to FIG. 10A and FIG. 10B, subsequent charging phase 711 of sensing sequence 601 refers to subsequent charging phase 711 of sensing sequence 601 shown in FIG. 7B.

In FIG. 10A and FIG. 10B, during subsequent charging phase 711, data lines 272 and 273 can be charged to different positive voltages. For example, data line 272 (FIG. 10A) can be charged to a voltage Vx' (where Vx'>V0) and data line 273 (FIG. 10B) can be charged to voltage Vx", which can be the sum of voltage Vinit and voltage Vx' (Vx"=Vinit+Vx').

In FIG. 10A, the output node of latch B can be changed to information H (from information L in FIG. 9A). Information H can have a value, such that transistor 816 of circuit $820_{272}$ (FIG. 10A) can be turned off. Thus, node 835 of circuit $820_{272}$ can be decoupled from node 850 (ground) during subsequent charging phase 711 associated with FIG. 10A. The output node of latch A of circuit $820_{272}$ in FIG. 10A can be changed to information L (from information H in FIG. 9A). Information L in FIG. 10A can have a value, such that transistor 808 of circuit $820_{272}$ can be turned off. Thus, during subsequent charging phase 711 associated with FIG. 10A, a circuit current through transistors 806 and 808 is not formed between nodes 835 and data line 272.

Transistor 802 of circuit $820_{272}$ can be turned on based on the value of information H at the output node of latch B of circuit $820_{272}$. Signal CLAMP_L can be provided with a voltage (e.g., a sum of voltage Vt and voltage Vx) to turn on transistor 804, such that a current path 1031 can be formed between node 801 and data line 272 through transistors 802 and 804. Current path 1031 allows data line 272 to be charged to voltage Vx'. Voltage Vx' can be based on (e.g., equal to) voltage Vx.

In circuit $820_{273}$ of FIG. 10B, a current path 931b can be formed between nodes 801 and data line 273. A current path 1032 can be formed between node 835 and data line 273. Current path 1032 can be parallel with (e.g., in addition to) a portion of current path 931b between node 835 and data line 273. Signal CLAMP_H can be provided with a voltage (e.g., a sum of voltage Vt, voltage Vinit, and voltage Vx) to turn on transistor 806, such that current path 1032 can be formed between node 835 and data line 273 through transistors 806 and 808. The combination of parallel current paths 931 and 1032 allows data line 273 to be charged to voltage Vx".

Although current path 1032 is described herein as current associated with circuit path between node 835 and data line 273, current path 1032 can be part of current path between node 801 and data line 273 through transistors 802, 808, and 806. Thus, current path 1032 can be part of a circuit path between nodes 801 and data line 273 that includes transistors 802, 806, and 808. Therefore, current path 1032 and current path 931b can be conducted by respective circuit paths (a circuit path including transistor 802 and 804, and a circuit path including transistors 802, 806, and 808) that share a circuit portion between node 801 and node 835, in which the circuit portion includes transistor 802.

In FIG. 10B, switch 817 and information TRANSFER can be configured to provide information L and H (as described above) at appropriate time intervals based on the operations described above with reference to FIG. 9A, FIG. 9B, FIG. 10A, and FIG. 10B.

Thus, as described above, during initial charging phase 710, data line 273 (FIG. 9B) can be charged to voltage Vinit while data line 272 (FIG. 9A) can be held at voltage V0 (e.g., 0V). During subsequent charging phase 711 (FIG. 10A and FIG. 10B), data lines 272 and 273 can be charged to different positive voltages (e.g., voltages Vx' and Vx" (where Vx'<Vx").

As described above with reference to FIG. 8, FIG. 9A, and FIG. 10A, circuit path 831 in FIG. 8 can be configured to not conduct current (FIG. 9A) during a time interval (e.g., between time Ta and Tb in FIG. 7B) at which initial charging phase 710 is performed. However, circuit path 831 in FIG. 8 can be configured to conduct current (represented by current path 1031 in FIG. 10A) during a time interval (e.g., between times Tb and Tc in FIG. 7B) at which subsequent charging phase 711 is performed.

As described above with reference to FIG. 8, FIG. 9B, and FIG. 10B, circuit path 831 in FIG. 8 can be configured to conduct current (represented by current path 931a in FIG. 9B) during a time interval (e.g., between time Ta and Tb in FIG. 7B) at which initial charging phase 710 is performed. Circuit path 831 in FIG. 8 can also be configured to conduct current (represented by current path 931b in FIG. 10B) during a time interval (e.g., between time Tb and Tc in FIG. 7B) at which subsequent charging phase 711 is performed.

As described above with reference to FIG. 8, FIG. 9B, and FIG. 10B, circuit path 832 in FIG. 8 can be configured to not conduct current (FIG. 9B) during a time interval (e.g., between time Ta and Tb in FIG. 7B). However, circuit path 832 in FIG. 8 can be configured to conduct current (represented by current path 1032 in FIG. 10B) during a time interval (e.g., between time Tb and Tc in FIG. 7B) at which subsequent charging phase 711 is performed.

Figure 11:
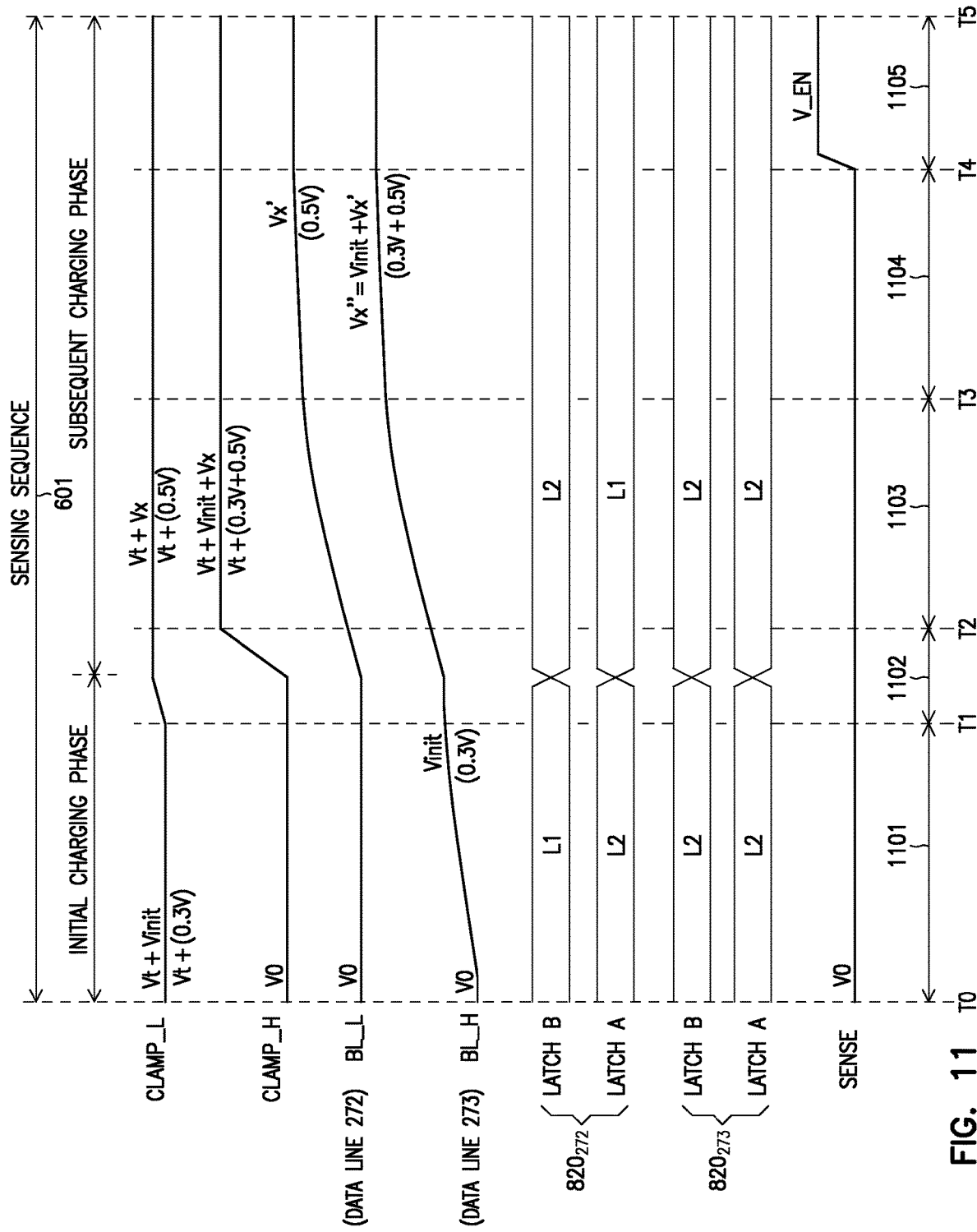
FIG. 11 shows a timing a diagram illustrating more details of the waveforms of some of the signals during a sensing sequence of the circuits of FIG. 9A, FIG. 9B, FIG. 10A, and FIG. 10B, according to some embodiments described herein.

FIG. 11 shows a timing diagram illustrating more details of the waveforms of signals BL_L and BL_H and other signals of respective circuits $820_{272}$ and $820_{273}$ in FIG. 9A, FIG. 9B, FIG. 10A, and FIG. 10B during sensing sequence 601, according to some embodiments described herein. The waveforms of signals BL_L and BL_H in FIG. 11 are the same as the waveforms of signals BL_L and BL_H, respectively, shown in FIG. 7B. However, FIG. 11 show more details of signals BL_L and BL_H relative to other signals of circuits $820_{272}$ and $820_{273}$ of FIG. 9A, FIG. 9B, FIG. 10A, and FIG. 10B.

In FIG. 11, times T0 through T5 represent different times (different points in times) of sensing sequence 601. Times T0 and T5 can correspond to times Ta and Tc, respectively, of FIG. 7B. In FIG. 11, time T0 occurs before time T1. Time T1 occurs before time T2, and so on in which time T5 occurs last. Times T0 through T5 can be divided into time intervals (durations) 1101, 1102, 1103, 1104, and 1105. Time interval 1101 occurs before time interval 1102; time interval 1102 occurs before time interval 1103, and so on in which time interval 1105 occurs last.

Time interval 1101 can be part of an initial charging phase of sensing sequence 601, such as initial charging phase 710 described above with reference to FIG. 7B, FIG. 9A, and FIG. 9B. Time intervals 1103 1104, and 1105 can be part of a subsequent charging phase of sensing sequence 601, such as subsequent charging phase 711 described above with reference to FIG. 7B, FIG. 10A, and FIG. 10B.

Time interval 1102 can occur during a transition phase between the initial charging phase (e.g., initial charging phase 710) and the subsequent charging phase (e.g., subsequent charging phase 711) of sensing sequence 601. Thus, time interval 1102 can be part of the initial charging phase, part of the subsequent charging phase, or both.

Time interval 1105 (which can be part of subsequent charging phase 711) can be considered as a time interval at (or near) the end of sensing sequence 601. After time T5, the signals (e.g., signal BL_L and BL_H) on the respective data lines can be reset to a reset voltage which can be voltage V0 (e.g., 0V). Then, a new sensing sequence (e.g., sensing sequence 602 in FIG. 6) can begin after time T5 to verify next target levels of selected memory cells. The waveform of the signals on the active data lines in the next sensing sequence (e.g., sensing sequence 602) can be similar to (or the same as) the waveforms of the signals shown in FIG. 11.

The following description refers to FIG. 9A, FIG. 9B, FIG. 10A, FIG. 10B, and FIG. 11. In FIG. 11, signals CLAMP_L, CLAMP_H, BL_L, BL_H, and SENSE are the same as those shown in FIG. 9A, FIG. 9B, FIG. 10A, FIG. 10B. FIG. 11 shows the waveform of voltages signals CLAMP_L, CLAMP_H, BL_L, BL_H, and SENSE and their relative voltages during different time intervals.

The values of voltages shown in FIG. 11 are example values. Other values can be used based on the figuration of memory device 200. For example, FIG. 11 shows voltage Vinit having a value of 0.3V as an example. However, voltage Vinit can have other positive values. In another example, FIG. 11 shows voltage Vx having a value of 0.5V as an example. However, voltage Vx can have other positive values. In FIG. 11, voltage Vx' can be based on (e.g., equal to) voltage Vx (e.g., Vx'=Vx=0.5V). Thus, voltage Vx" (which is the sum of voltages Vinit and Vx) can have an example value of 0.8V.

In FIG. 11, the values of information contained in latches A and B of circuits $820_{272}$ and circuit $820_{273}$ during time intervals 1101, 1102, 1103, 1104, and 1105 can be based on the values of target levels (e.g., levels L1 and L2 in the example of FIG. 11) of selected memory cells of memory cell strings coupled to respective data lines 272 and 273. The values of information L and information H are based on the values of levels L1 and L2, respectively. For example, during time interval 1101, latches A and B of circuit $820_{272}$ in FIG. 9A can have values corresponding to levels L1 and L2, respectively. Thus, during time interval 1101 (which is part of initial charging phase 710) in FIG. 11, the output nodes of latches A and B of circuit $820_{272}$ in FIG. 9A can have information L and information H, respectively. In another example, during time interval 1101 in FIG. 11, both latches A and B of circuit $820_{273}$ can have values corresponding to level L2. Thus, during time interval 1101 (which is part of initial charging phase 710) in FIG. 11, the output nodes of both latches A and B circuit $820_{273}$ in FIG. 9B can have information H.

The values of latches A and B of one or both of circuits $820_{272}$ and $820_{273}$ at time interval 1101 can be changed (swapped) to different values at time interval 1103. For example, memory device 200 can switch the value of latch B of circuits $820_{272}$ from a value corresponding to L1 to level L2, and the value of latch A from level L1 to level L2. During time interval 1102 of FIG. 11, memory device 200 can use switch 817 (FIG. 8) to provide appropriate information (e.g., level L1 or L2) to latches A and B of one or both of circuits $820_{272}$ and $820_{273}$.

As shown in FIG. 9A and FIG. 11, during time interval 1101, latches A and B can be provided with information, such that the outputs (e.g., output nodes) of latches A and B can have information L or H. Information L can correspond to a voltage that can turn off (or keep off) a transistor (e.g., n-channel transistor like one of transistors of circuit 820 shown in FIG. 9A). Information H can correspond to a voltage that can turn on (or keep on) a transistor (e.g., n-channel transistor) of circuit 820$_{272}$ shown in FIG. 9A. Thus, information L and H can have opposite values (e.g., complementary values).

In FIG. 11, a capacitance coupling effect between data lines 272 and 273 may occur during time interval 1103. The coupling effect may be settled between time T3 and T5 where data lines 272 and 273 may reach their respective voltages (e.g., Vx' and Vx") during time interval 1105. Signal SENSE may be activated from voltage V0 (e.g., 0V) to voltage V_EN (e.g., sense amplifier enable voltage) during time interval 1105. A sensing phase of a sensing sequence of a write verify stage can occur during time interval 1105. Memory device 200 can operate to sense data lines 272 and 273 (e.g., based on the signals at nodes 835 of 820$_{272}$ and 820$_{273}$ in FIG. 10A and FIG. 10B) during time interval 1105 (e.g., during a sensing phase). Memory device 200 can determine whether selected memory cells reach their respective target levels (e.g., target threshold voltages) based on the values of the signals at nodes 835 of 820$_{272}$ and 820$_{273}$ in FIG. 10A and FIG. 10B during time interval 1105 in FIG. 11.

Structuring and operating memory device 200 as described above allows memory device 200 to have improvements and benefits over similar conventional memory devices. For example, memory device 200 can be configured in an alternative configuration where memory device 200 can charge all active data lines (e.g., both data lines 272 and 273 in FIG. 11) to a positive voltage during an initial charging phase (e.g., during time interval 1101 in FIG. 11) without holding some of the active data lines to ground. However, such an alternative configuration may have a drawback in comparison with the configuration described above. For example, charging all (e.g., two or more) active data lines during an initial charging time in an alternative configuration may cause the active data lines to have longer settling time than that of the configuration described above with reference to FIG. 7A through FIG. 11. The settling time discussed herein includes a time interval between times T2 and time T5.

As an example, in an alternative configuration, both data lines 272 and 273 may be charged to a positive voltage (e.g., voltage Vinit) from time T0. This may add additional coupling capacitance between data lines and cause significant increase in charging time of data lines 272 and 273. For example, in the alternative configuration, data line 272 may couple up to data line 272 (which has a higher voltage than data line 273). Thus, it would take more time for the charge on data line 272 to come back (e.g., back to a predetermined level). As a result of longer charge-up time in the alternative configuration, the benefit of concurrently verifying multiple target levels of the selected memory cells would be significantly diminished.

In the configuration of the memory device described herein (e.g., circuit and operations of memory device 200), by holding a data line (e.g., data line 272 in FIG. 11) associated with a selected memory cell at voltage V0 (e.g., 0V) and charging another data line 273 (in FIG. 11) to voltage Vinit, a proper difference potential between data lines 272 and 273 can be created in advance (e.g., created during time interval 1101). This can significantly decrease the overall charge-up time of the data lines 272 and 273. This can shorten the settling time (e.g., time interval between time T2 and time T5 can be shorter than that of an alternative configuration). Therefore, the overall performance of the memory devices described herein (e.g., memory device 200) can be improved.

FIG. 12 shows an apparatus in the form of a system (e.g., electronic system) 1200, according to some embodiments described herein. Part of system 1200 or the entire system 1200 can include, or be included in, a system-on-chip, a system on package, a solid state drive (SSD), a cellphone, a tablet, a computer, an electronic module in an automobile, or other types of electronic systems. As shown in FIG. 12, system 1200 can include a processor 1210, a memory device 1220, a memory controller 1230, a graphics controller 1240, an I/O controller 1250, a display 1252, a keyboard 1254, a pointing device 1256, at least one antenna 1258, a connector 1215, and a bus 1260 (e.g., conductive lines formed on a circuit board (not shown) of system 1200).

In some arrangements, system 1200 does not have to include a display. Thus, display 1252 can be omitted from system 1200. In some arrangements, system 1200 does not have to include any antenna. Thus, antenna 1258 can be omitted from system 1200.

Each of processor 1210, memory device 1220, memory controller 1230, graphics controller 1240, and I/O controller 1250 can include a die and can be part of an IC package.

Processor 1210 can include a general-purpose processor or an application-specific integrated circuit (ASIC). Processor 1210 can include a central processing unit (CPU).

Memory device 1220 can include a dynamic random-access memory (DRAM) device, a static random-access memory (SRAM) device, a flash memory device (e.g., NAND flash memory device), phase change memory, a combination of these memory devices, or other types of memory.

In an example, memory device 1220 can include memory device 100 or 200 described above with reference to FIG. 1 through FIG. 11. Thus, memory device 1220 can include the structure of the memory devices (e.g., memory device 100 or 200) and memory operations (e.g., the write operation) described above with reference to FIG. 1 through FIG. 11. In FIG. 12, processor 1210 or memory controller 1230 can communicate with memory device 1220 to cause memory device 1220 to perform memory operations described above with reference to FIG. 1 through FIG. 11. For example, processor 1210 or memory controller 1230 can send instructions (e.g., commands in the form of signals) to memory device 1220 to cause memory device 1220 to perform a write, read, or erase operation. The write operation can include any of the write operations described above with reference to FIG. 1 through FIG. 11.

Display 1252 can include a liquid crystal display (LCD), a touchscreen (e.g., capacitive or resistive touchscreen), or another type of display. Pointing device 1256 can include a mouse, a stylus, or another type of pointing device.

I/O controller 1250 can include a communication module for wired or wireless communication (e.g., communication through one or more antennas 1258). Such wireless communication may include communication in accordance with WiFi communication technique, Long Term Evolution Advanced (LTE-A) communication technique, or other communication techniques.

I/O controller 1250 can also include a module to allow system 1200 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1215 can be arranged (e.g., can include terminals, such as pins) to allow system 1200 to be coupled to an external device (or system). This may allow system 1200 to communicate (e.g., exchange information) with such a device (or system) through connector 1215. Connector 1215 may be coupled to I/O controller 1250 through a connection 1216 (e.g., a bus).

Connector 1215, connection 1216, and at least a portion of bus 1260 can include elements (e.g., conductive terminals, conductive lines, or other conductive elements) that conform with at least one of USB, DP, HDMI, Thunderbolt, PCIe, Ethernet, and other specifications.

FIG. 12 shows the elements (e.g., devices and controllers) of system 1200 arranged separately from each other as an example. In some arrangements, two or more elements of system 1200 can be located on the same IC package, same subsystem, or same device. For example, memory device 1220 and memory controller 1230 can be included in the same SSD or same memory subsystem of system 1200.

The illustrations of apparatuses (e.g., memory devices 100, 200 and 1220) and methods (e.g., method of operating memory devices 100, 200, and 1220 including method 500) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 1220) or a system (e.g., a computer, a cellular phone, or other electronic systems) that includes a device such as any of memory devices 100, 200, and 1220.

Any of the components described above with reference to FIG. 1 through FIG. 12 can be implemented in a number of ways, including simulation via software. Thus, apparatuses, e.g., memory devices 100, 200, and 1220, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 1220 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 12 include apparatuses, and methods of forming the apparatuses. One of the apparatuses includes first and second data lines coupled to respective first and second memory cell strings; an access line shared by first and second memory cells of the first and second memory cell strings, respectively; and a control unit including circuitry to perform operations including charging the first data line to a first voltage during a first time interval of an operation performed on first and second memory cells; holding the second data line at a second voltage during the first time interval; charging the first data line to a third voltage during a second time interval of the operation; charging the second data line to a fourth voltage during the second time interval; and determining, during the second time interval of the operation, whether the first memory cell reaches a first threshold voltage and whether the second memory cell reaches a second threshold voltage. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising: a first data line; a first memory cell string coupled to the first data line, the first memory cell string including a first memory cell; a second data line; a second memory cell string coupled to the second data line, the second memory cell string including a second memory cell; an access line shared by the first and second memory cells; and a control unit including circuitry to perform operations including: charging the first data line to a first voltage during a first time interval of an operation performed on the first and second memory cells; holding the second data line at a second voltage during the first time interval, wherein the second voltage is less than the first voltage; charging the first data line to a third voltage during a second time interval of the operation, wherein the third voltage is greater than the first voltage; charging the second data line to a fourth voltage during the second time interval, wherein the fourth voltage is less than the third voltage and greater than the second voltage; determining, during the second time interval of the operation, whether the first memory cell reaches a first threshold voltage; and determining, during the second time interval, whether the second memory cell reaches a second threshold voltage.

2. The apparatus of claim 1, wherein the second voltage is ground potential.

3. The apparatus of claim 1, wherein the third voltage is greater than the first voltage, and the fourth voltage is less than the third voltage and greater than the second voltage.

4. The apparatus of claim 1, wherein a difference between the third and fourth voltages is proportional to a difference between the first and second voltages.

5. The apparatus of claim 1, wherein the operation further comprises applying a ramp voltage to the access line during the operation, and wherein a portion of the ramp voltage is applied to the access line during the first and second time intervals.

6. The apparatus of claim 1, wherein each of the first and second memory cells is configured to store multiple bits of information, wherein the first threshold voltage corresponds to a first value of the multiple bits, and wherein the second threshold voltage corresponds to a second value of the multiple bits.

7. The apparatus of claim 1, wherein the first and second threshold voltages are two adjacent target threshold voltages in a threshold voltage range associated with values of information to be stored in the first and second memory cells.

8. A method comprising: charging a first data line to a first positive voltage during a first time interval of a write verify stage of a memory device, the first data line coupled to a first memory cell string; holding a second data line at ground potential during the first time interval, the second data line coupled to a second memory cell string; charging the first data line to a second positive voltage during a second time interval of the write verify stage; charging the second data line to a third positive voltage during the second time interval; determining, during the second time interval, whether a first memory cell of the first memory cell string reaches a first threshold voltage; and determining, during the second time interval, whether a second memory cell of the second memory cell string reaches a second threshold voltage.

9. The method of claim 8, wherein the first threshold voltage is greater than the second threshold voltage.

10. The method of claim 8, wherein the second positive voltage is greater than the first positive voltage.

11. The method of claim 8, wherein the second positive voltage is greater than the third positive voltage.

12. The method of claim 8, wherein the first threshold voltage and the second threshold voltage are adjacent threshold voltages among threshold voltages of a range of threshold voltages, and the range of voltages represents different values of information stored in memory cells of the first and second memory cell string.

* * * * *